(12) United States Patent
Machida

(10) Patent No.: US 11,774,181 B2
(45) Date of Patent: Oct. 3, 2023

(54) LOOP HEAT PIPE WITH RECESSED TOP OR BOTTOM SURFACE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 348 days.

(21) Appl. No.: 17/038,415

(22) Filed: Sep. 30, 2020

(65) Prior Publication Data

US 2021/0116184 A1    Apr. 22, 2021

(30) Foreign Application Priority Data

Oct. 17, 2019    (JP) .................................. 2019-190325

(51) Int. Cl.
| | | |
|---|---|---|
| F28D 15/00 | (2006.01) | |
| F28D 15/02 | (2006.01) | |
| F28D 15/04 | (2006.01) | |

(52) U.S. Cl.
CPC ....... F28D 15/0266 (2013.01); F28D 15/046 (2013.01)

(58) Field of Classification Search
CPC ............... F28D 15/0266; F28D 15/046; F28D 15/0233; F28D 2015/0225
See application file for complete search history.

(56) References Cited

U.S. PATENT DOCUMENTS

| | | | | |
|---|---|---|---|---|
| 4,724,826 A | * | 2/1988 | Muramatsu | F24S 10/504 165/170 |
| 6,164,368 A | * | 12/2000 | Furukawa | F28D 15/0266 361/679.09 |
| 7,506,682 B2 | * | 3/2009 | Bhatti | H01L 23/427 165/80.4 |

(Continued)

FOREIGN PATENT DOCUMENTS

| | | |
|---|---|---|
| EP | 3460375 | 3/2019 |
| JP | 2015-094490 | 5/2015 |

(Continued)

OTHER PUBLICATIONS

Extended European search report dated Feb. 9, 2021 issued with respect to the corresponding European patent application No. 20200559.1.

*Primary Examiner* — Travis Ruby
(74) *Attorney, Agent, or Firm* — IPUSA, PLLC

(57) ABSTRACT

A loop heat pipe includes: an evaporator; a condenser; a liquid pipe that connects the evaporator and the condenser; a vapor pipe that connects the evaporator and the condenser to form a loop flow path; and a porous body provided inside of a part of the evaporator, the condenser, the liquid pipe, and the vapor pipe. The evaporator, the condenser, the liquid pipe, and the vapor pipe have a first main surface. At least one recessed portion is formed in at least part of a first area, located directly above or below the flow path, of the first main surface, and is not formed in a second area, located directly above or directly below a pipe wall of the flow path, of the first main surface and is not formed in a third area, located directly above or below the porous body, of the first main surface.

7 Claims, 28 Drawing Sheets

(56) References Cited

U.S. PATENT DOCUMENTS

| | | | | |
|---|---|---|---|---|
| 2009/0101308 A1* | 4/2009 | Hardesty | ............ | F28D 15/0266 |
| | | | | 165/80.4 |
| 2011/0056670 A1* | 3/2011 | Meyer, IV | .......... | H01L 23/3672 |
| | | | | 165/122 |
| 2014/0054009 A1* | 2/2014 | Chang | ................ | F28D 15/0233 |
| | | | | 165/104.11 |
| 2016/0128234 A1* | 5/2016 | Uesugi | ..................... | F28F 3/02 |
| | | | | 165/80.4 |
| 2016/0259383 A1* | 9/2016 | Shioga | ................ | F28D 15/0266 |
| 2017/0049006 A1* | 2/2017 | McLaughlin | ....... | H01L 23/3672 |
| 2019/0128620 A1 | 5/2019 | Machida | | |
| 2019/0242652 A1 | 8/2019 | Machida | | |
| 2019/0285354 A1 | 9/2019 | Machida | | |

FOREIGN PATENT DOCUMENTS

| | | |
|---|---|---|
| JP | 2019-082309 | 5/2019 |
| JP | 2019-135434 | 8/2019 |

\* cited by examiner

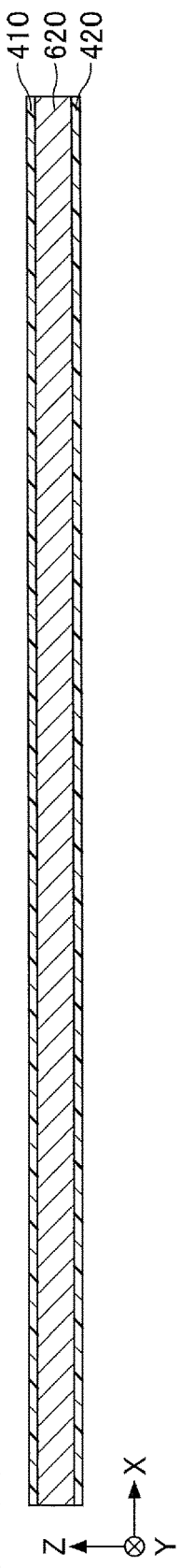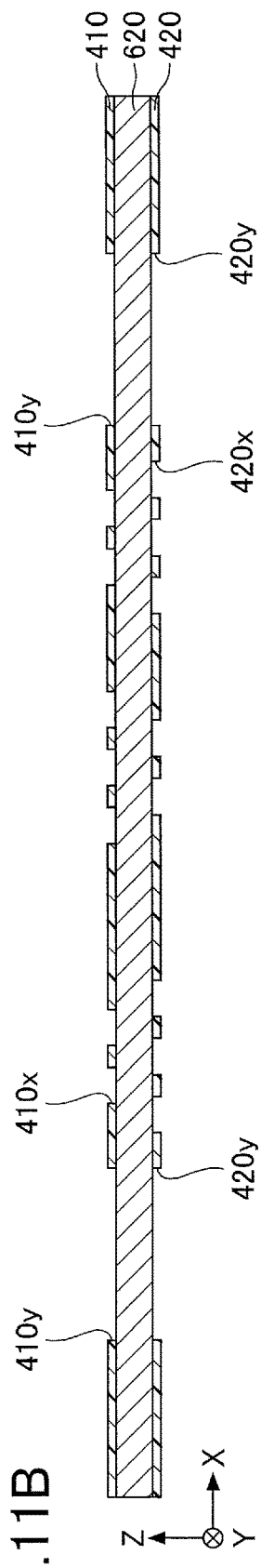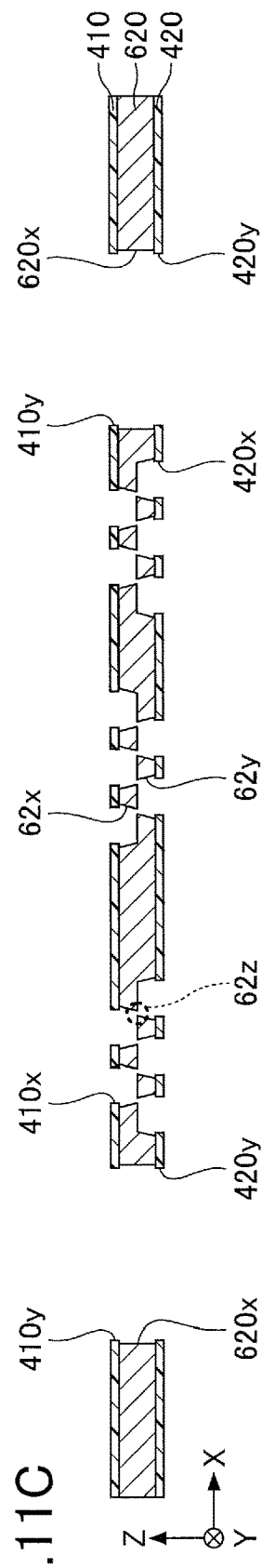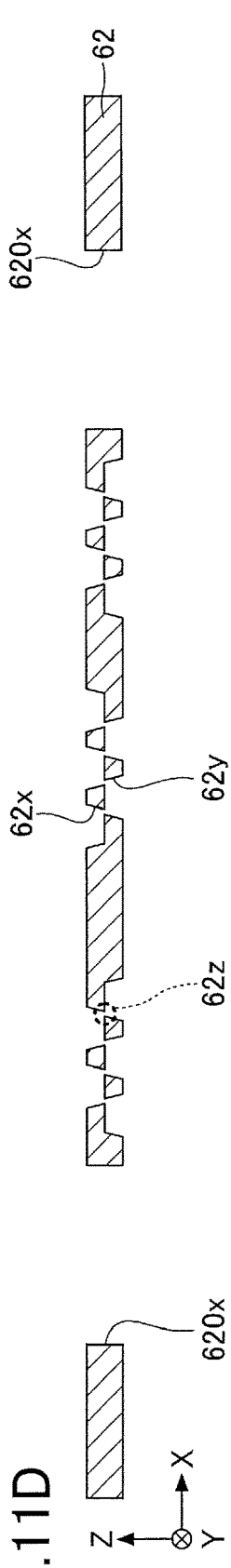

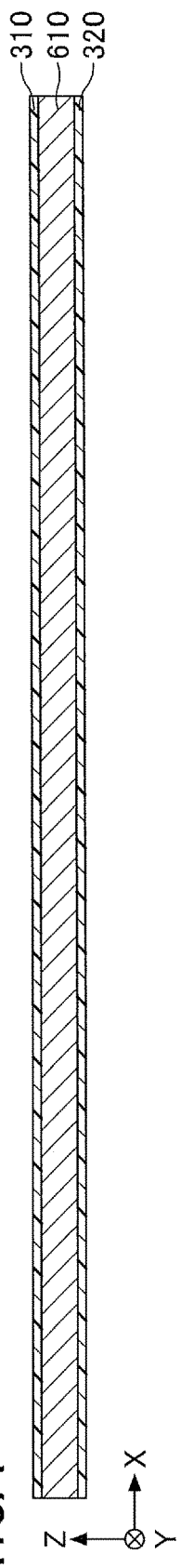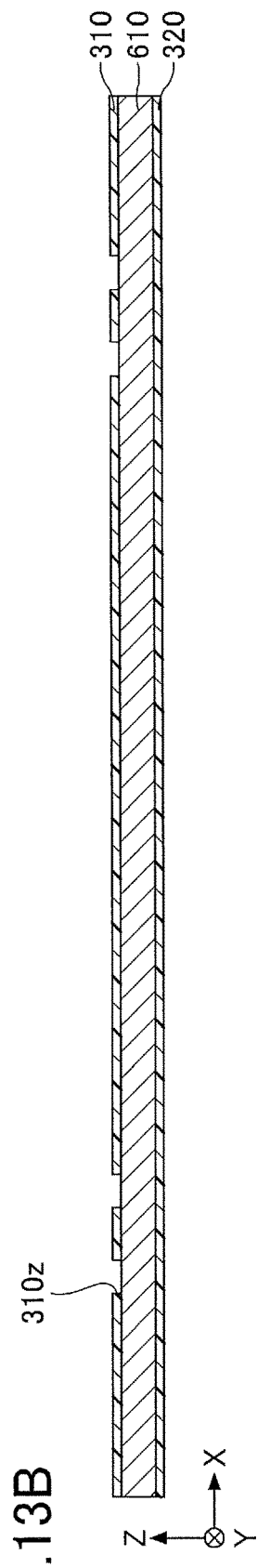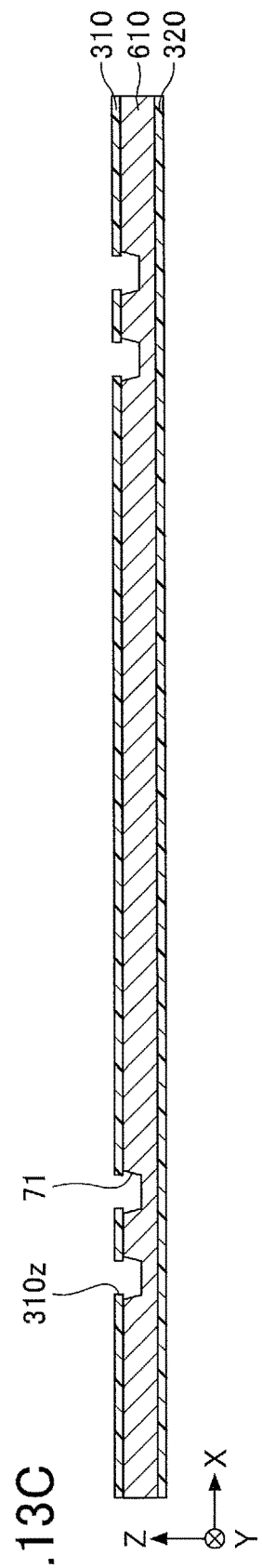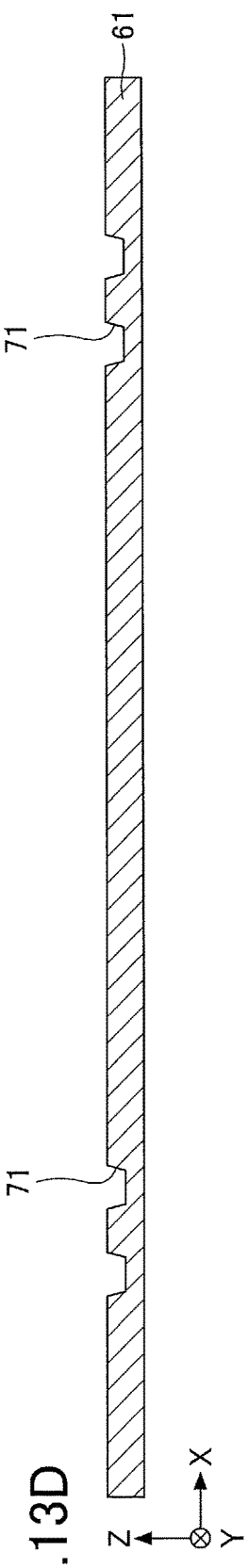

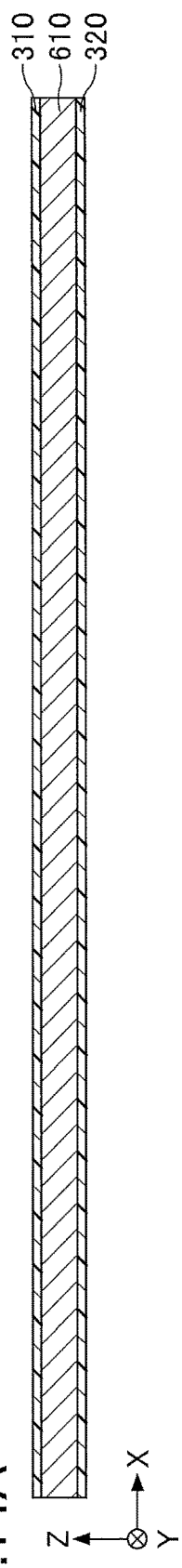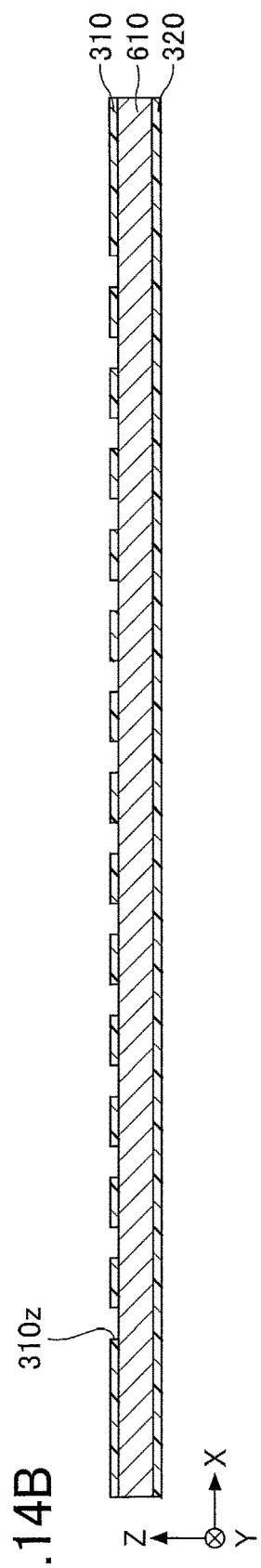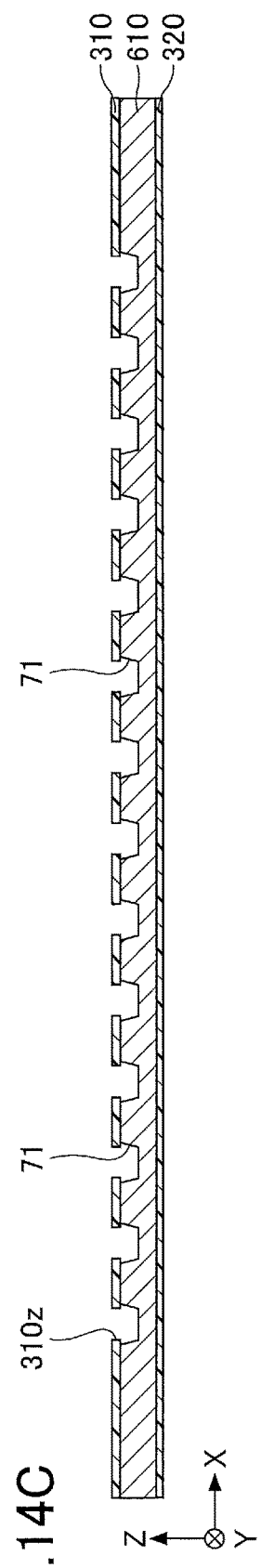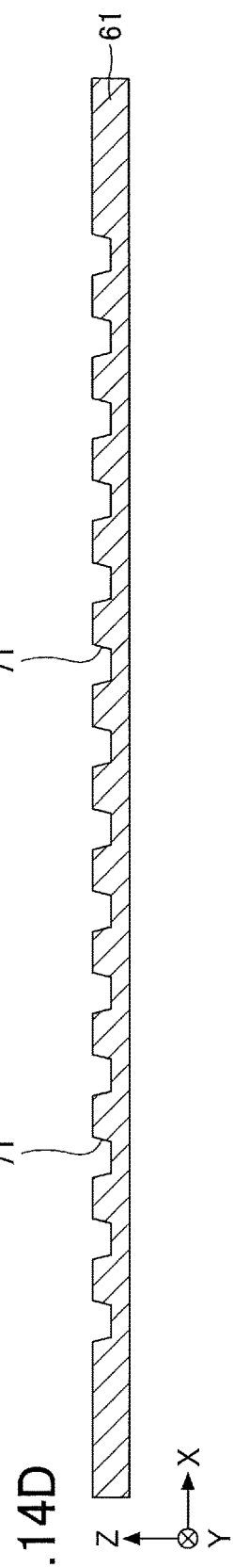

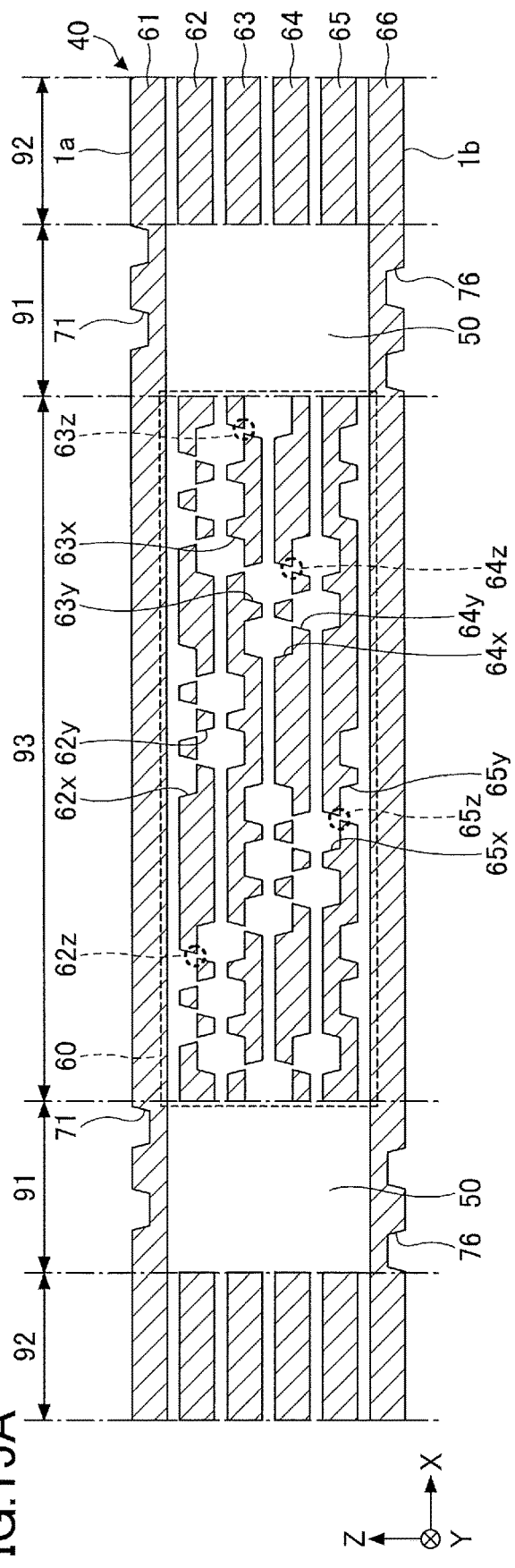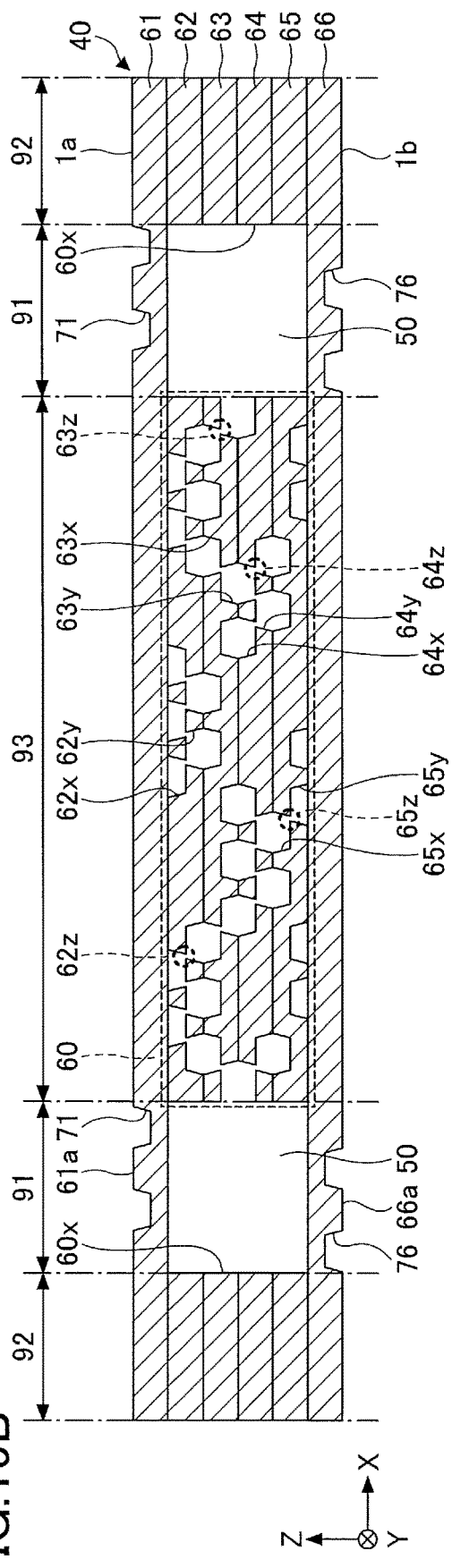

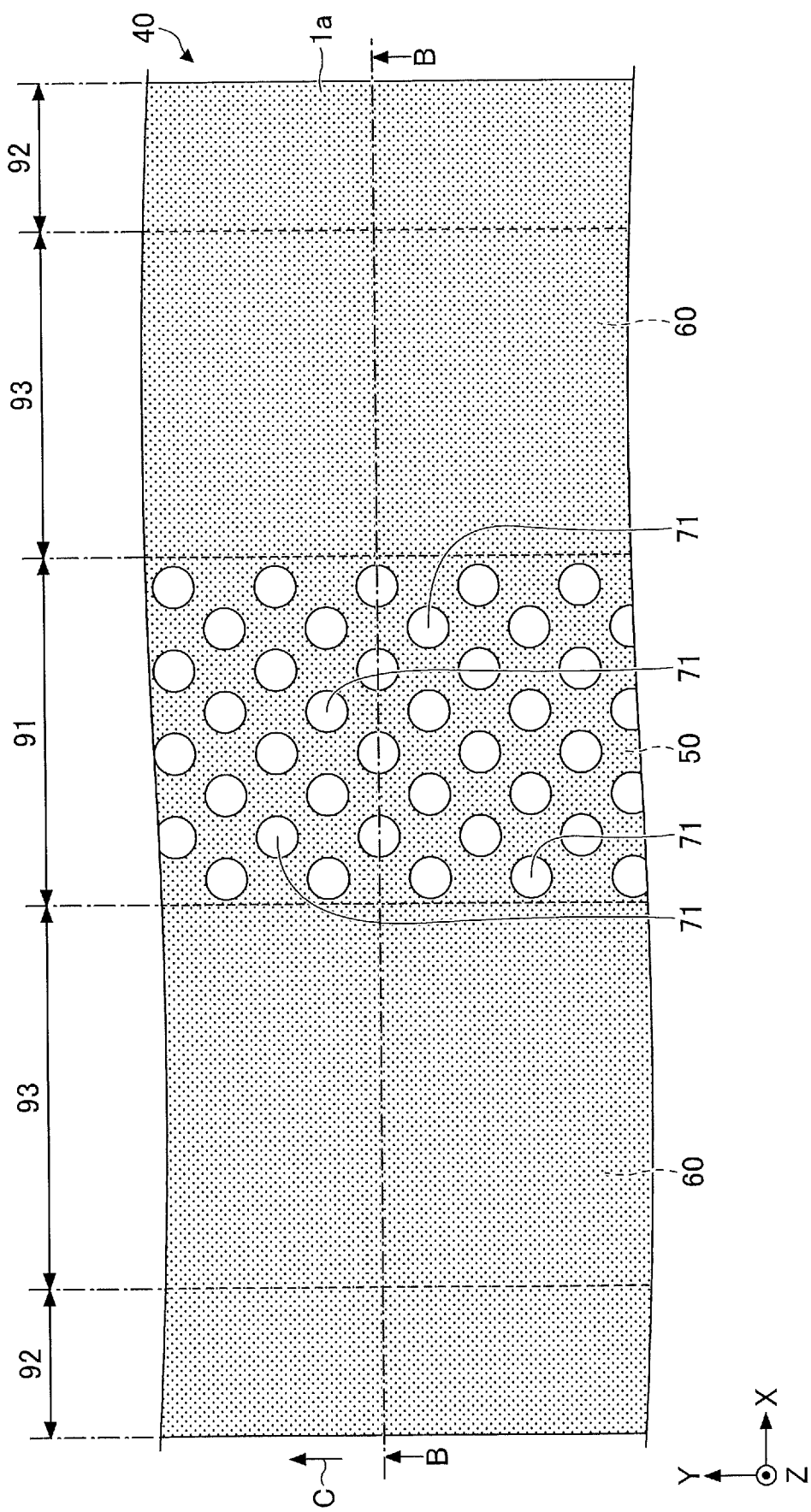

LOOP HEAT PIPE WITH RECESSED TOP OR BOTTOM SURFACE

CROSS-REFERENCE TO RELATED APPLICATION

This application is based upon and claims priority to Japanese Patent Application No. 2019-190325, filed on Oct. 17, 2019, the entire contents of which are incorporated herein by reference.

FIELD

The present disclosure relates to a loop heat pipe.

BACKGROUND

Heat pipes are known as devices to cool heat generating components installed in electronic devices, such as a central processing unit (CPU). Heat pipes are devices that transport heat using the phase transition of a working fluid.

Examples of heat pipes include a loop heat pipe that includes an evaporator configured to vaporize a working fluid with the heat of a heat generating component and a condenser configured to cool and condense the vaporized working fluid, where the evaporator and the condenser are connected by a liquid pipe and a vapor pipe that foist a loop flow path. In the loop heat pipe, the working fluid flows unidirectionally in the loop flow path.

Also, a porous body is provided in the evaporator and the liquid pipe of the loop heat pipe. The working fluid in the liquid pipe is guided to the evaporator by a capillary force generated in the porous body to prevent vapor from reversely flowing from the evaporator to the liquid pipe. Numerous pores are formed in the porous body. The respective pores are formed by partially communicating bottomed holes formed on one surface side of a metal layer with bottomed holes formed on the other surface side (see, for example, Patent Document 1).

Related-Art Documents

Patent Documents

[Patent Document 1] Japanese Patent No. 6400240
[Patent Document 2] Japanese Laid-open Patent Publication No. 2019-082309
[Patent Document 3] Japanese Laid-open Patent Publication No. 2015-094490

Conventional loop heat pipes may not provide sufficient heat dissipation performance.

The present disclosure has an object to provide a loop heat pipe that enables to enhance heat dissipation performance and a method of manufacturing the same.

SUMMARY

According to one aspect of the present disclosure, a loop heat pipe includes: an evaporator configured to vaporize a working fluid; a condenser configured to condense the working fluid; a liquid pipe that connects the evaporator and the condenser; a vapor pipe that connects the evaporator and the condenser to form a loop flow path with the liquid pipe; and a porous body provided inside of a part of the evaporator, the condenser, the liquid pipe, and the vapor pipe; wherein the evaporator, the condenser, the liquid pipe, and the vapor pipe have a first main surface, wherein at least one recessed portion is formed in at least part of a first area, located directly above or directly below the flow path, of the first main surface, and wherein the at least one recessed portion is not formed in a second area, located directly above or directly below a pipe wall of the flow path, of the first main surface and is not formed in a third area, located directly above or directly below the porous body, of the first main surface.

According to the present disclosure, it is possible to enhance heat dissipation performance.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 11A to 11D are drawings illustrating processes of manufacturing the loop heat pipe according to the first embodiment (part 1);

FIGS. 13A to 13D are drawings illustrating processes of manufacturing the loop heat pipe according to the first embodiment (part 3);

FIGS. 14A to 14D are drawings illustrating processes of manufacturing the loop heat pipe according to the first embodiment (part 4);

FIGS. 15A and 15B are drawings illustrating processes of manufacturing the loop heat pipe according to the first embodiment (part 5);

FIG. 17 is a plan view illustrating a liquid pipe according to a modified example of the first embodiment;

DESCRIPTION OF EMBODIMENTS

Figure 1:
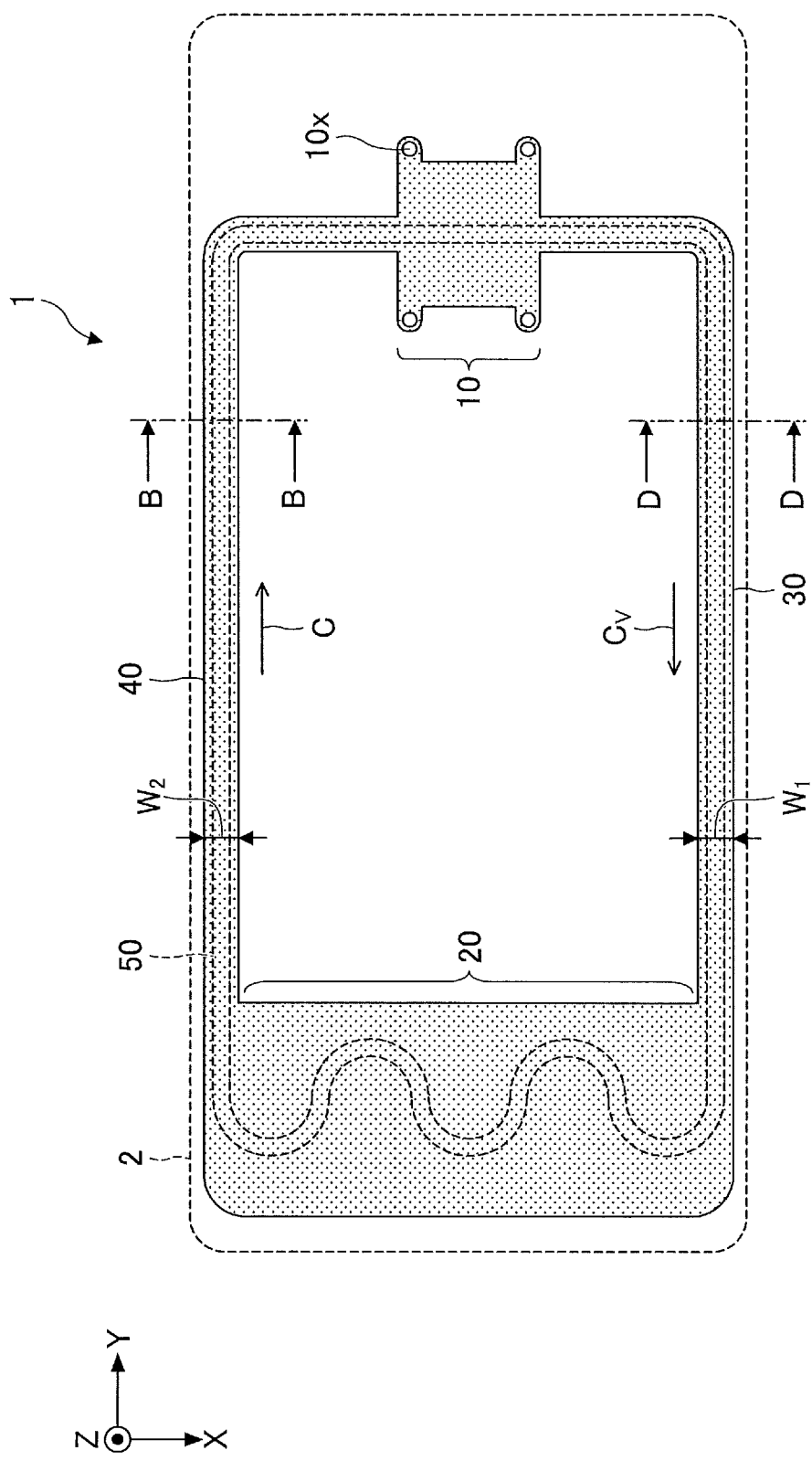
FIG. 1 is a schematic plan view of a loop heat pipe according to a first embodiment.

In the following, embodiments will be described with reference to the accompanying drawings. It should be noted that in the drawings, same constituent elements may be referred to by the same reference numerals, and duplicate descriptions may be omitted as appropriate.

First Embodiment

[Structure of Loop Heat Pipe According to the First Embodiment]

First, a structure of a loop heat pipe according to the first embodiment will be described. FIG. 1 is a schematic plan view of a loop heat pipe 1 according to the first embodiment.

Referring to FIG. 1, the loop heat pipe 1 includes an evaporator 10, a condenser 20, a vapor pipe 30, and a liquid pipe 40. The loop heat pipe 1 can be accommodated in, for example, a mobile electronic device 2 such as a smartphone or a tablet terminal.

According to the loop heat pipe 1, the evaporator 10 is configured to vaporize a working fluid C to generate vapor Cv. The condenser 20 is configured to condense the vapor Cv of the working fluid C. The evaporator 10 and the condenser 20 are connected by the vapor pipe 30 and the liquid pipe 40. The vapor pipe 30 and the liquid pipe 40 form a loop flow path 50 in which the working fluid C or the vapor Cv flows.

Figure 2:
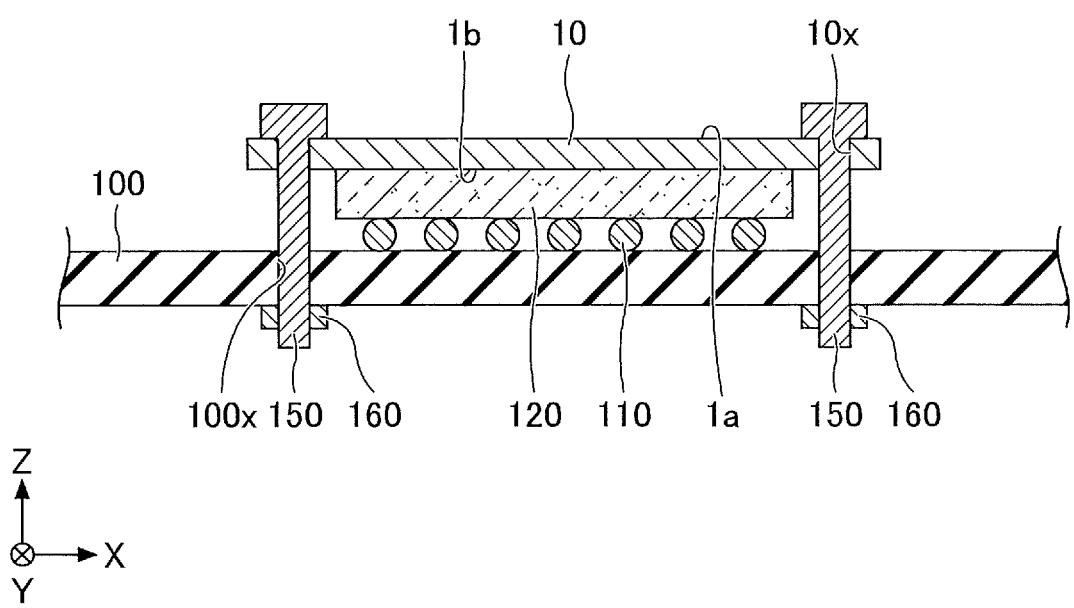
FIG. 2 is a cross-sectional view of an evaporator and its vicinity of the loop heat pipe according to the first embodiment.

FIG. 2 is a cross-sectional view of the evaporator 10 and its vicinity of the loop heat pipe 1 according to the first embodiment. Referring to FIG. 1 and FIG. 2, for example, four through holes 10x are formed in the evaporator 10. The evaporator 10 is fixed to a circuit board 100 by inserting bolts 150 into the respective through holes 10x formed in the evaporator 10 and respective through holes 100x formed in the circuit board 100 and tightening the bolts 150 with nuts 160 on the lower surface side of the circuit board 100. The evaporator 10, the condenser 20, the vapor pipe 30, and the liquid pipe 40 have an upper surface 1a and a lower surface 1b that is the opposite side of the upper surface 1a. The upper surface 1a is an example of a first main surface, and the lower surface 1b is an example of a second main surface.

In the present disclosure, a plan view refers to viewing from a direction perpendicular to the upper surface 1a or the lower surface 1b.

For example, a heat generating component 120 such as a CPU is mounted on the circuit board 100 through bumps 110. The upper surface of the heat generating component 120 adheres to the lower surface 1b of the evaporator 10. The working fluid C in the evaporator 10 vaporizes due to heat generated in the heat generating component 120, so that the vapor Cv is generated.

Referring to FIG. 1, the vapor Cv generated at the evaporator 10 is guided to the condenser 20 through the vapor pipe 30 to condense in the condenser 20. As a result, heat generated at the heat generating component 120 migrates to the condenser 20, so that an increase in the temperature of the heat generating component 120 is suppressed. The working fluid C condensed in the condenser 20 is guided to the evaporator 10 through the liquid pipe 40. A width W1 of the vapor pipe 30 may be, for example, approximately 8 mm. Also, a width W2 of the liquid pipe 40 may be, for example, approximately 6 mm.

The working fluid C is not limited to a particular kind, but is preferably a fluid of a high vapor pressure and a high latent heat of vaporization to efficiently cool the heat generating component 120 with latent heat of vaporization. Examples of such a fluid include ammonia, water, chlorofluorocarbon, alcohol, and acetone.

Each of the evaporator 10, the condenser 20, the vapor pipe 30, and the liquid pipe 140 may have a structure in which a plurality of metal layers are layered. The metal layers are, for example, copper layers, which are excellent in thermal conductivity, and are directly joined together by solid-state welding or the like. The thickness of each metal layer may be, for example, approximately 50 μm to approximately 200 μm.

It should be noted that the metal layers are not limited to copper layers, and may be made of, for example, stainless steel layers, aluminum layers, magnesium alloy layers, or the like. In addition, the number of layered metal layers is not particularly limited.

Figure 3:
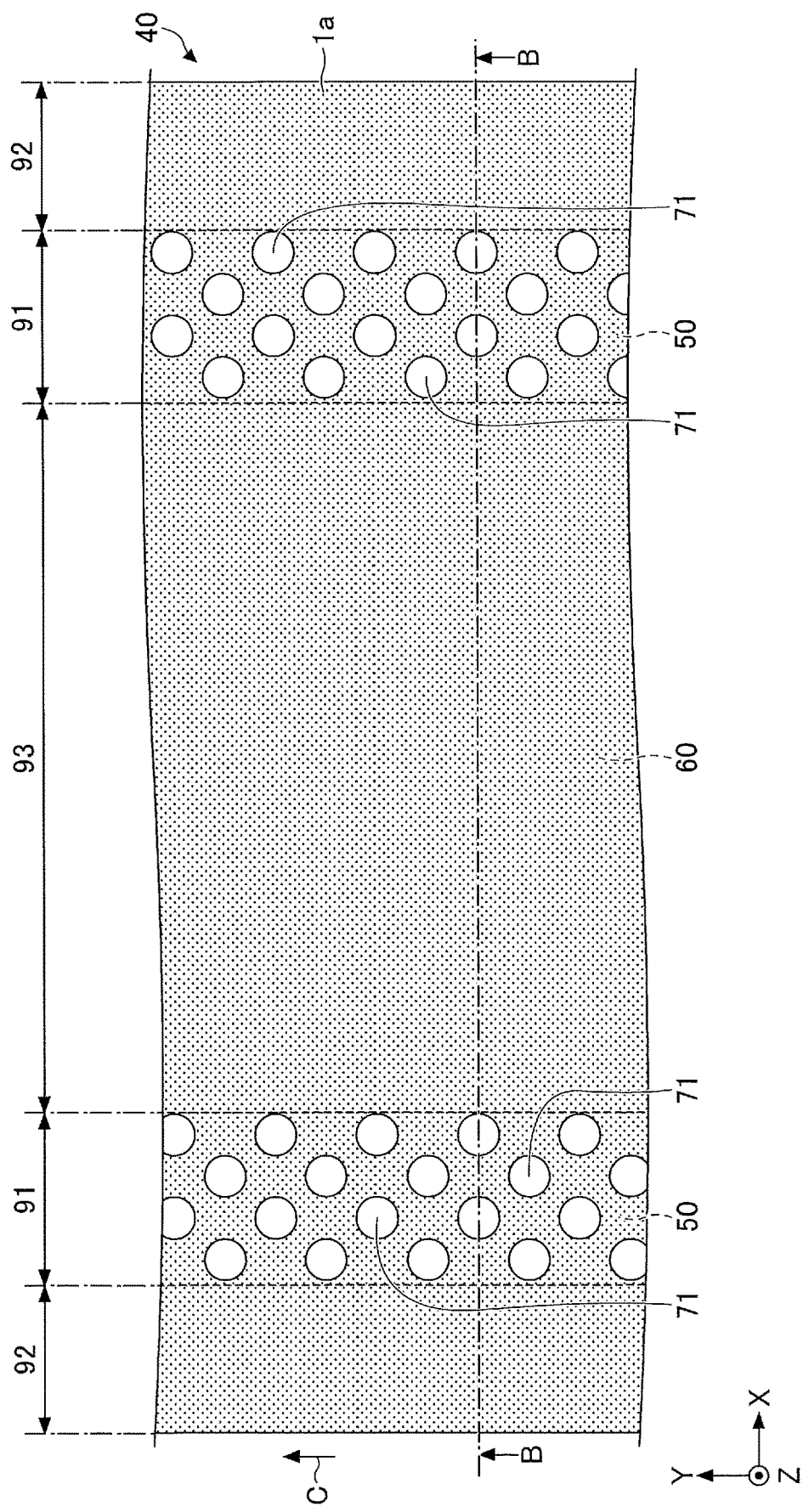
FIG. 3 is a plan view illustrating a liquid pipe according to the first embodiment.
Figure 4:
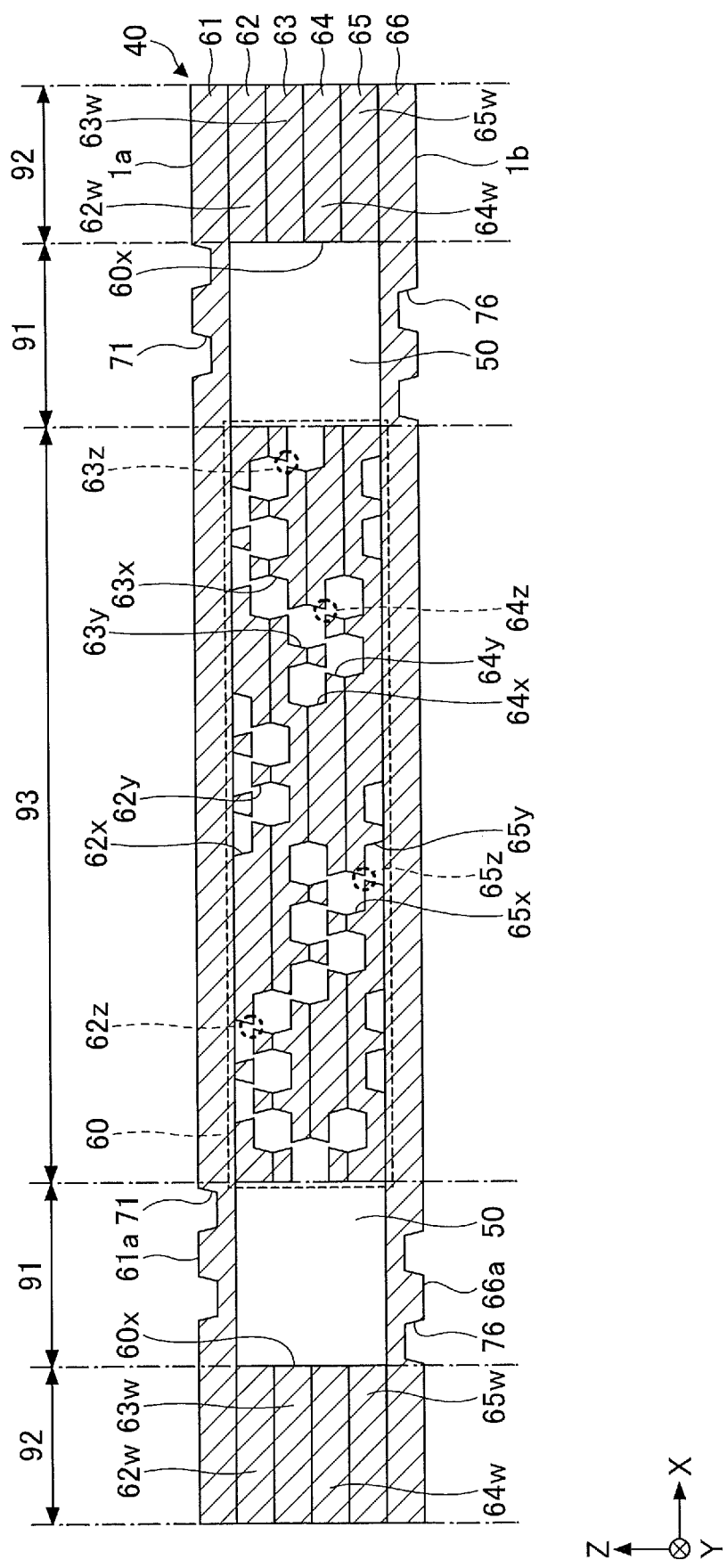
FIG. 4 is a cross-sectional view illustrating the liquid pipe and a porous body in the liquid pipe according to the first embodiment.

A porous body is provided in the liquid pipe 40. FIG. 3 is a plan view illustrating the liquid pipe 40 according to the first embodiment, and FIG. 4 is a cross-sectional view illustrating the liquid pipe 40 and a porous body 60 in the liquid pipe 40 according to the first embodiment. FIG. 4 illustrates a cross-section taken along the line B-B of FIG. 1 and FIG. 3. As illustrated in FIG. 4, the porous body 60 is provided within the liquid pipe 40. Between both side surfaces of the porous body 60 and both pipe wall surfaces 60x (the inner wall surfaces of the metal layers 62 to 65), flow paths 50 through which the working fluid C flows are formed. The porous body 60 will be described in detail below.

Figure 5:
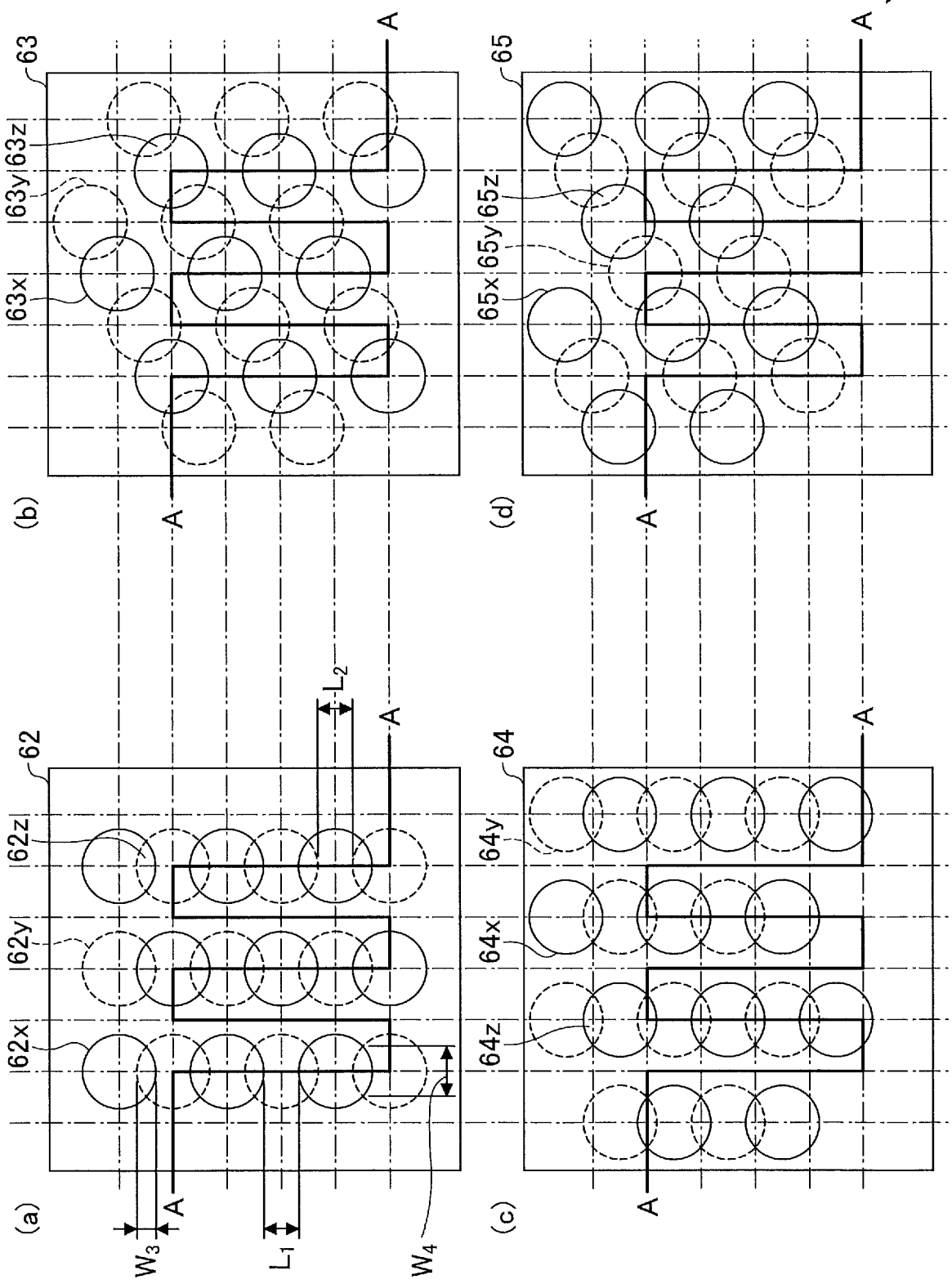
FIG. 5 is a plan view illustrating an arrangement of bottomed holes at respective metal layers from the second layer to the fifth layer.

FIG. 5 is a plan view illustrating an arrangement of bottomed holes at the respective metal layers from the second layer to the fifth layer. In FIG. 5, the portion illustrated by line A-A corresponds to the cross-section of the porous body 60 in FIG. 4.

The porous body 60 may have, for example, a structure in which four layers of metal layers 62 to 65 are layered. The metal layers 62 to 65 are, for example, copper layers, which are excellent in thermal conductivity, and are directly joined together by solid-state welding or the like. The thickness of each of the metal layers 61 to 66 may be, for example, approximately 50 μm to approximately 200 μm. It should be noted that the metal layers 61 to 66 are not limited to copper layers, and may be made of, for example, stainless steel layers, aluminum layers, or magnesium alloy layers. In addition, the number of layered metal layers is not limited, and five or less or seven or more metal layers may be layered.

It should be noted that in FIG. 4 and FIG. 5, the Z direction is the layering direction of the metal layers 61 to 66, the X direction is a direction in a plane perpendicular to the Z direction, and the Y direction is a direction orthogonal to the X direction in the plane. The same applies to the other drawings.

The porous body 60 is in contact with the lower surface of the first metal layer 61 (one outermost layer) and the upper surface of the sixth metal layer 66 (the other outermost layer). No holes or grooves are formed in the metal layer 61 or the metal layer 66. With respect to the above, as illustrated in FIG. 4 and (a) of FIG. 5, on the metal layer 62 that is the second layer that constitutes the porous body 60, a plurality of bottomed holes 62x that are recessed from the upper surface side to the substantially central portion in the thickness direction and a plurality of bottomed holes 62y that are recessed from the lower surface side to the substantially central portion in the thickness direction are formed.

The bottomed holes 62x and the bottomed holes 62y are alternately arranged in the X direction in a plan view. Also, the bottomed holes 62x and the bottomed holes 62y are alternately arranged in the Y direction in a plan view. The bottomed holes 62x and the bottomed holes 62y, which are alternately arranged in the X direction, partially overlap with each other in a plan view, and the overlapping and communicating portions form pores 62z. The bottomed holes 62x and the bottomed holes 62y, which are alternately arranged in the Y direction, are formed with a predetermined interval and do not overlap in a plan view. Therefore, the bottomed holes 62x and the bottomed holes 62y, which are alternately arranged in the Y direction, do not form pores.

The bottomed holes 62x and 62y may be circular in diameter of approximately 100 μm to approximately 300 μm, for example, but may be of any shape, such as elliptical or polygonal. A depth of the bottomed holes 62x and 62y may be, for example, about half the thickness of the metal layer 62. An interval $L_1$ between the adjacent bottomed holes 62x may be, for example, approximately 100 μm to approximately 400 μm. An interval $L_2$ between the adjacent bottomed holes 62y may be, for example, approximately 100 μm to approximately 400 μm.

The inner walls of the bottomed holes 62x and 62y can be tapered to widen from the bottom surface side toward the opening portion side. However, the inner walls of the bottomed holes 62x and 62y are not limited to a tapered shape, and may be perpendicular to the bottom surface. The shapes of the inner wall surfaces of the bottomed holes 62x and 62y are not limited to tapered shapes or vertical. For example, the inner wall surfaces of the bottomed holes 62x and 62y may be recessed shapes of curved surfaces. Examples of the recessed shapes of curved surfaces include, for example, a recessed shape of which a cross-sectional shape is substantially semi-circular or substantially semi-elliptical. A width $W_3$ of the pores 62z in the short direction may be, for example, approximately 10 μm to approximately 50 μm. Also, A width $W_4$ of the pores 62z in the longitudinal direction may be, for example, approximately 50 μm to approximately 150 m.

As illustrated in FIG. 4 and (b) of FIG. 5, on the metal layer 63 that is the third layer that constitutes the porous body 60, a plurality of bottomed holes 63x that are recessed from the upper surface side to the substantially central portion in the thickness direction and a plurality of bottomed holes 63y that are recessed from the lower surface side to the substantially central portion in the thickness direction are formed.

On the metal layer 63, rows in which only the bottomed holes 63x are arranged in the X direction and rows in which only the bottomed holes 63y are arranged in the X direction are alternately arranged in the Y direction. In the rows alternately arranged in the Y direction, the bottomed holes 63x and the bottomed holes 63y that are in the adjacent rows overlap partially in a plan view, and the overlapping and communicating portions form pores 63z.

It should be noted that the central positions of the bottomed holes 63x and the bottomed holes 63y that are adjacent to each other to form the pores 63z are displaced in the X direction. In other words, the bottomed holes 63x and the bottomed holes 63y that form the pores 63z are alternately arranged in an oblique direction with respect to the X direction and the Y direction. The shapes and the like of the bottomed holes 63x and 63y and the pores 63z may be similar to, for example, the shapes and the like of the bottomed holes 62x and 62y and the pores 62z.

The bottomed holes 62y of the metal layer 62 and the bottomed holes 63x of the metal layer 63 are formed at overlapping positions in a plan view. Therefore, pores are not formed at the interface between metal layer 62 and metal layer 63.

As illustrated in FIG. 4 and (c) of FIG. 5, on the metal layer 64 that is the fourth layer that constitutes the porous body 60, a plurality of bottomed holes 64x that are recessed from the upper surface side to the substantially central portion in the thickness direction and a plurality of bottomed holes 64y that are recessed from the lower surface side to the substantially central portion in the thickness direction are formed.

The bottomed holes 64x and the bottomed holes 64y are alternately arranged in the X direction in a plan view. Also, the bottomed holes 64x and the bottomed holes 64y are alternately arranged in the Y direction in a plan view. The bottomed holes 64x and the bottomed holes 64y, which are alternately arranged in the X direction, partially overlap with each other in a plan view, and the overlapping and communicating portions form pores 64z. The bottomed holes 64x and the bottomed holes 64y, which are alternately arranged in the Y direction, are formed with a predetermined interval and do not overlap in a plan view. Therefore, the bottomed holes 64x and the bottomed holes 64y, which are alternately arranged in the Y direction, do not form pores. The shapes and the like of the bottomed holes 64x and 64y and the pores 64z may be similar to, for example, the shapes and the like of the bottomed holes 62x and 62y and the pores 62z.

The bottomed holes 63y of the metal layer 63 and the bottomed holes 64x of the metal layer 64 are formed at overlapping positions in a plan view. Therefore, no pores are formed at the interface between metal layer 63 and metal layer 64.

As illustrated in FIG. 4 and (d) of FIG. 5, on the metal layer 65 that is the fifth layer that constitutes the porous body 60, a plurality of bottomed holes 65x that are recessed from the upper surface side to the substantially central portion in the thickness direction and a plurality of bottomed holes 65y that are recessed from the lower surface side to the substantially central portion in the thickness direction are formed.

On the metal layer 65, rows in which only the bottomed holes 65x are arranged in the X direction and rows in which only the bottomed holes 65y are arranged in the X direction are alternately arranged in the Y direction. In the rows alternately arranged in the Y direction, the bottomed holes 65x and the bottomed holes 65y that are in the adjacent rows overlap partially in a plan view, and the overlapping and communicating portions form pores 65z.

It should be noted that the central positions of the bottomed holes 65x and the bottomed holes 65y that are adjacent to each other to form the pores 65z are displaced in the X direction. In other words, the bottomed holes 65x and the bottomed holes 65y that form the pores 65z are alternately arranged in an oblique direction with respect to the X direction and the Y direction. The shapes and the like of the bottomed holes 65x and 65y and the pores 65z may be similar to, for example, the shapes and the like of the bottomed holes 62x and 62y and the pores 62z.

The bottomed holes 64y of the metal layer 64 and the bottomed holes 65x of the metal layer 65 are formed at overlapping positions in a plan view. Therefore, no pores are formed at the interface between metal layer 64 and metal layer 65.

The pores formed in the respective metal layers communicate with one another to spread three-dimensionally in the porous body 60. Therefore, the working fluid C spreads three-dimensionally in the mutually connected pores through capillary action.

At least part of the bottomed holes that constitute the porous body 60 communicate with the flow paths 50. Thereby, the working fluid C can permeate into the porous body 60. Also, because the porous body 60 is provided at the substantially central portion of the liquid pipe 40 the porous body 60 also serves as a support. Thereby, it is possible to prevent the liquid pipe 40 from being crashed due to, for example, pressurization at the tune of solid-state welding.

As described above, the porous body 60 is provided in the liquid pipe 40, and the porous body 60 extends along the liquid pipe 40 to the vicinity of the evaporator 10. Thus, the liquid-phase working fluid C in the liquid pipe 40 is guided to the evaporator 10 by a capillary force generated in the porous body 60.

As a result, even when the vapor Cv is urged to reversely flow in the liquid pipe 40 by heat leak from the evaporator 10 or the like, a capillary force that acts on the liquid-phase working fluid C from the porous body 60 can push back the vapor Cv to prevent the backflow of the vapor Cv.

It should be noted that an inlet port (not illustrated) for injecting the working fluid C is formed on the liquid pipe 40. The inlet port is sealed by a sealing member to keep the loop heat pipe 1 airtight.

As illustrated in FIG. 3 and FIG. 4, the upper surface 1a and the lower surface 1b of the liquid pipe 40 have first areas 91 that are located directly above or directly below the flow paths 50, second areas 92 that are located directly above or directly below the pipe walls (metal layers 62w to 65w) of the flow paths 50, and a third area 93 that is located directly above or directly below the porous body 60. The upper surface 1a of the liquid pipe 40 is the upper surface 61a of the metal layer 61 that is the first layer, and the lower surface 1b of the liquid pipe 40 is the lower surface 66a of the metal layer 66 that is the sixth layer. The first areas 91 overlap with the flow paths 50 in a plan view from the upper surface 1a or the lower surface 1b of the liquid pipe 40.

As illustrated in FIG. 3 and FIG. 4, a plurality of recessed portions 71 are formed on the upper surface 1a of the liquid pipe 40 that is the upper surface 61a of the metal layer 61 in a cross-section view. The plurality of recessed portions 71 are formed in the first areas 91. In other words, the plurality of recessed portions 71 are formed in the first areas 91 of the upper surface 61a of the metal layer 61, located directly above the flow path 50. The recessed portions 71 are, for example, bottomed holes that are recessed from the upper surface side to the substantially central portion in the thickness direction. For example, the plurality of recessed portions 71 may be dot-shaped. The recessed portions 71 may be circular in diameter of approximately 50 μm to approximately 300 μm, for example, but may be of any shape, such as elliptical or polygonal. A depth of the recessed portions 71 may be, for example, about half the thickness of the metal layer 61. An interval between the adjacent recessed portions 71 may be, for example, approximately 100 μm to approximately 400 μm. The plurality of recessed portions 71 may be arranged regularly, or the plurality of recessed portions 71 may be arranged irregularly.

As illustrated in FIG. 4, a plurality of recessed portions 76 are formed on the lower surface 1b of the liquid pipe 40 that is the lower surface 66a of the metal layer 66 in a cross-sectional view. Similarly to the recessed portions 71, the plurality of recessed portions 76 are formed in the first areas 91 (not illustrated in FIG. 3). In other words, the plurality of recessed portions 76 are famed in the first areas 91 of the lower surface 66a of the metal layer 66, located directly below the flow path 50. The recessed portions 76 are, for example, bottomed holes that are recessed from the lower surface side to the substantially central portion in the thickness direction. For example, the plurality of recessed portions 76 may be dot-shaped. The recessed portions 76 may be circular in diameter of approximately 50 μm to approximately 300 μm, for example, but may be of any shape, such as elliptical or polygonal. A depth of the recessed portions 76 may be, for example, about half the thickness of the metal layer 66. An interval between the adjacent recessed portions 76 may be, for example, approximately 100 μm to approximately 400 μm. The plurality of recessed portions 76 may be arranged regularly, or the plurality of recessed portions 76 may be arranged irregularly.

The inner walls of the recessed portions 71 and 76 can be tapered to widen from the bottom surface side toward the opening portion side. However, the inner walls of the recessed portions 71 and 76 are not limited to a tapered shape, and may be perpendicular to the bottom surface.

As illustrated in FIG. 3 and FIG. 4, the recessed portions 71 and 76 are respectively formed on the upper surface 1a and the lower surface 1b of the liquid pipe 40 so as not to overlap with the pipe walls of the flow paths 50 of the liquid pipe 40 (metal layers 62w to 65w) in a plan view. That is, the plurality of recessed portions 71 are not formed in the second areas 92 of the upper surface 61a of the metal layer 61, located directly above the pipe walls of the flow paths 50 of the liquid pipe 40. Also, the plurality of recessed portions 76 are not formed in the second areas 92 of the lower surface 66a of the metal layer 66, located directly below the pipe walls of the flow paths 50 of the liquid pipe 40. Although the loop heat pipe 1 can be manufactured through solid-state welding of the metal layers, it is difficult to apply sufficient external pressure to the portions where the recessed portions 71 and 76 are formed, as will be described in detail below. In a case in which the pressure is not sufficiently applied in the second areas 92, the bonding force between the metal layers of the pipe walls may decrease, making it difficult to secure sufficient air tightness. It should be noted that the upper surface 1a and the lower surface 1b at the second areas 92 are not required to be completely flat surfaces. For example, recessed portions on the order of nanometers may be formed in the second areas 92 so as to allow sufficient pressure to be applied at the time of solid-state welding.

As illustrated in FIG. 3 and FIG. 4, the recessed portions 71 and 76 are respectively formed on the upper surface 1a and the lower surface 1b of the liquid pipe 40 so as not to overlap with the porous body 60 in a plan view. That is, the plurality of recessed portions 71 are not formed in the third area 93 of the upper surface 61a of the metal layer 61, which is located directly above the porous body 60 of the liquid pipe 40. Also, the plurality of recessed portions 76 are not formed in the third area 93 of the lower surface 66a of the metal layer 66, which is located directly below the porous body 60 of the liquid pipe 40. In a case in which pressure is not sufficiently applied in the third area 93, the bonding force between the metal layers of the porous body 60 may decrease, causing a variation in the pore sizes and making it difficult to secure a desired capillary force. It should be noted that the upper surface 1a and the lower surface 1b at the third area 93 are not required to be completely flat surfaces. For example, recessed portions on the order of nanometers may be formed in the third area 93 so as to allow sufficient pressure to be applied at the time of solid-state welding.

Figure 6:
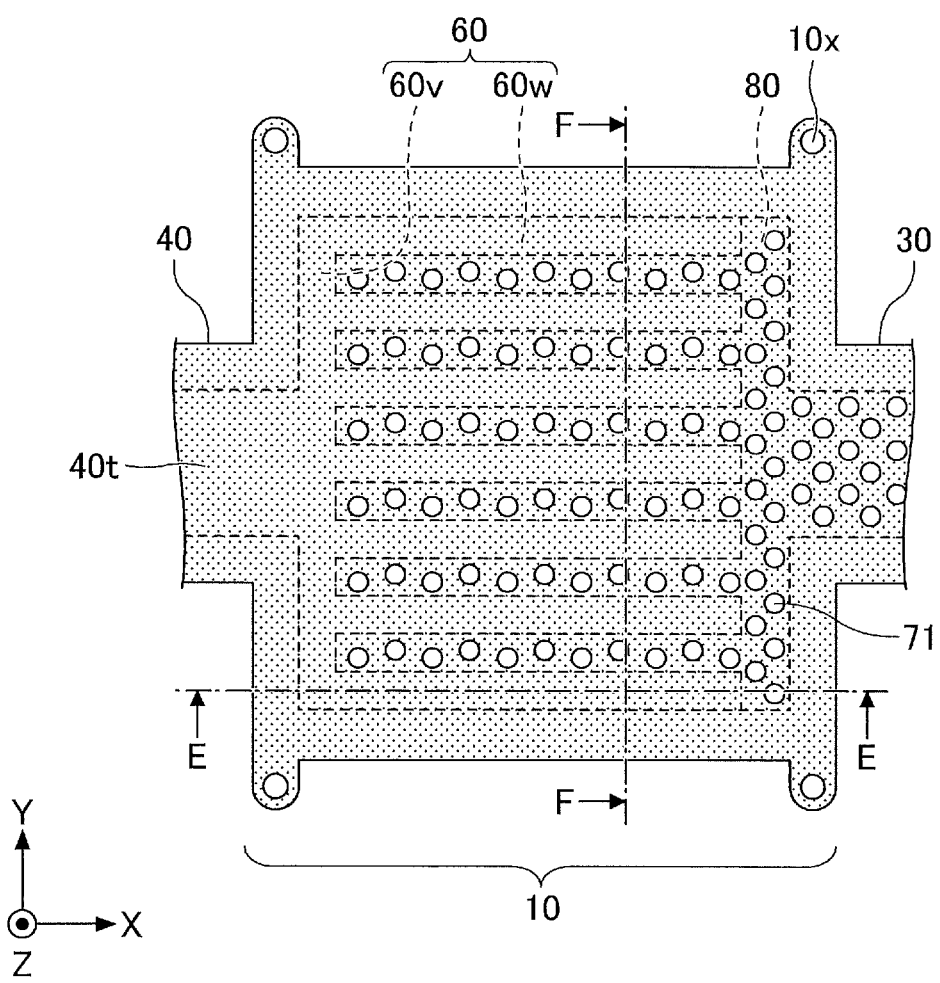
FIG. 6 is a plan view of an evaporator and its vicinity of the loop heat pipe according to the first embodiment.
Figure 7:
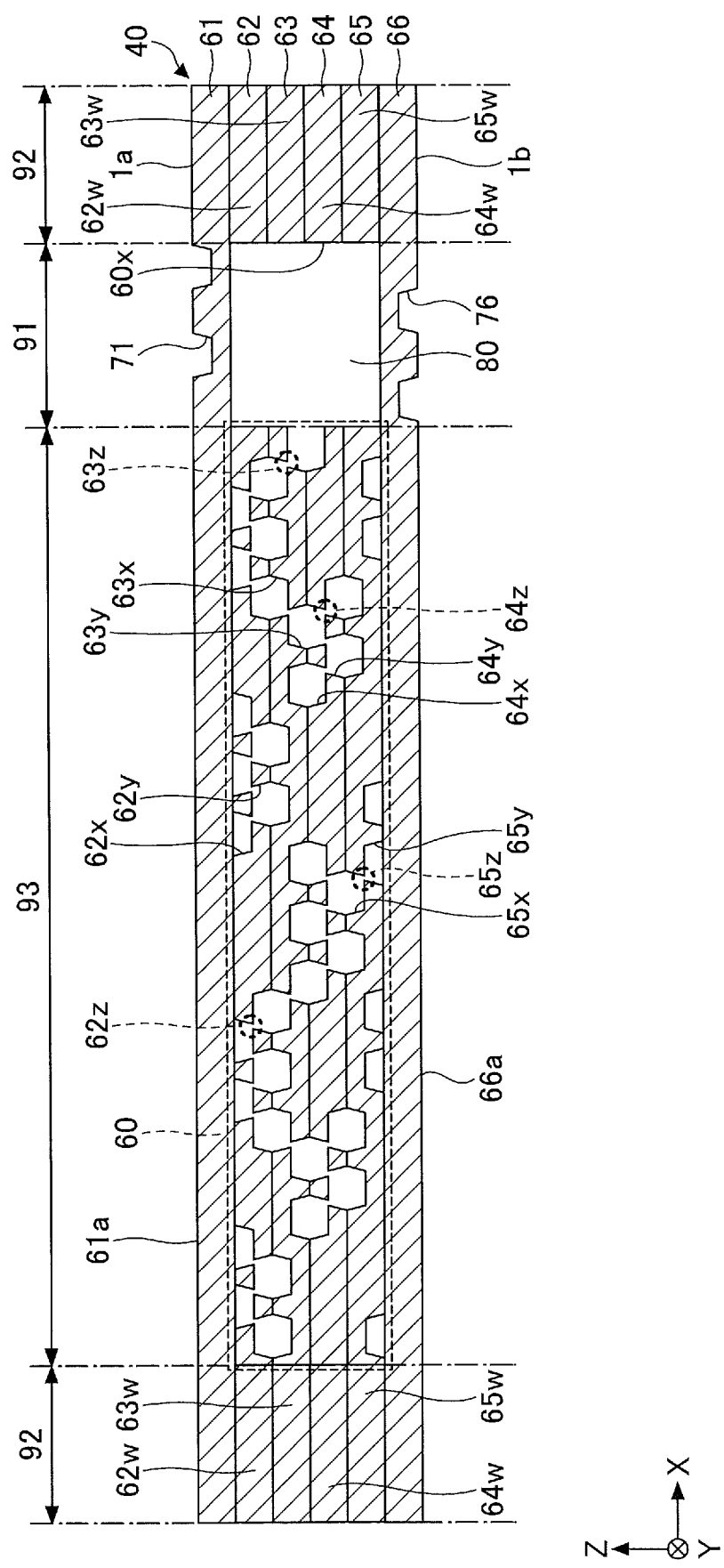
FIG. 7 is a cross-sectional view illustrating the evaporator and a porous body in the evaporator according to the first embodiment (part 1)
Figure 8:
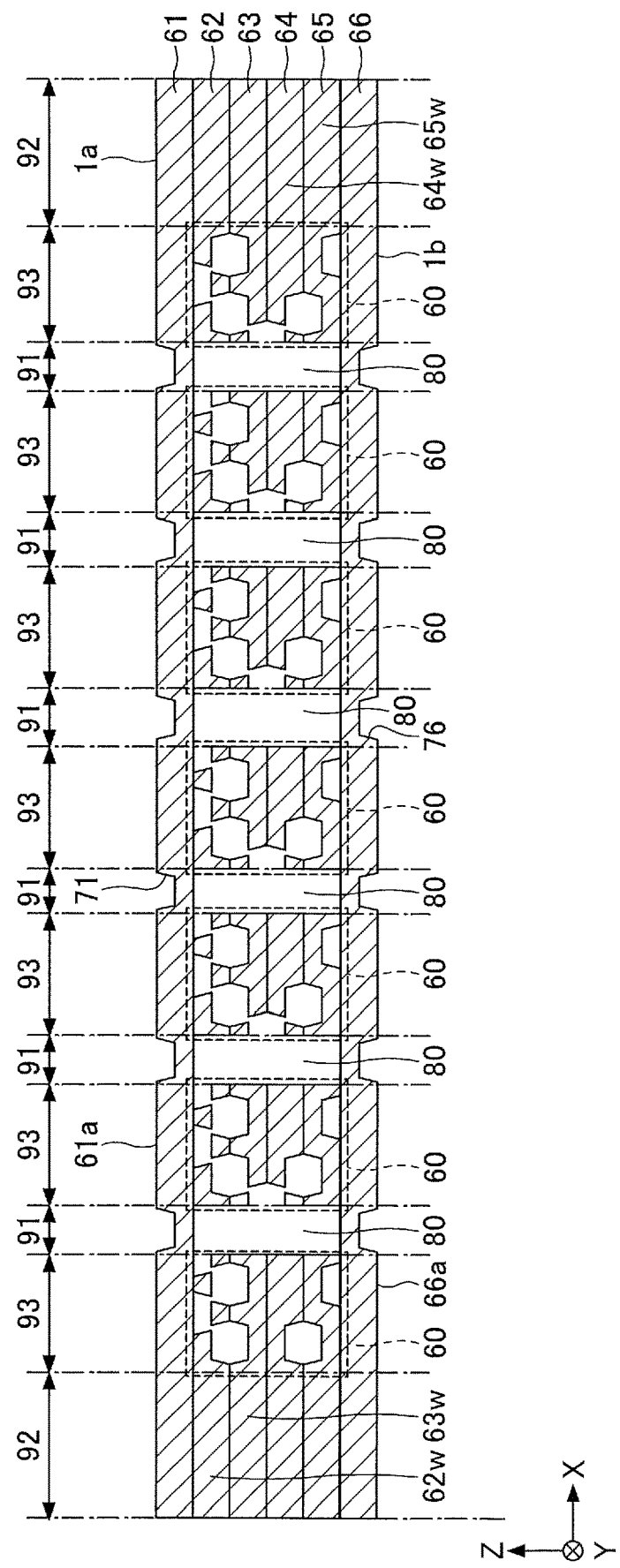
FIG. 8 is a cross-sectional view illustrating the evaporator and the porous body in the evaporator according to the first embodiment (part 2)

Similarly in the liquid pipe 40, a porous body 60 is provided in the evaporator 10. FIG. 6 is a plan view of the evaporator 10 and its vicinity. FIG. 7 and FIG. 8 are cross-sectional views illustrating the evaporator 10 and the porous body 60 provided in the evaporator 10. FIG. 7 illustrates a cross-section taken along the line E-E of FIG. 6 and FIG. 8 illustrates a cross-section taken along the line F-F of FIG. 6. The X direction illustrated in FIG. 6 indicates the length direction from the liquid pipe 40 side toward the vapor pipe 30 side and the Y direction indicates the length direction orthogonal to the length direction from the liquid pipe 40 side toward the vapor pipe 30 side.

The porous body 60 in the evaporator 10 illustrated in FIG. 6 includes a connection portion 60v and protruding portions 60w.

The connection portion 60v is provided at a part closest to the liquid pipe 40 in the X direction (the side where the evaporator 10 is connected to the liquid pipe 40) and extends in the Y direction in a plan view. A part of the surface of the connection portion 60v on the liquid pipe 40 side is in contact with the pipe walls of the evaporator 10, and the remaining part is in connection with a porous body 40t provided in the flow path of the liquid pipe 40. A part of the surface the connection portion 60v on the vapor pipe 30 side is connected to the protruding portions 60w, and the remaining part is in contact with the space 80.

The plurality of protruding portions 60w protrude from the connection portion 60v toward the vapor pipe 30 in a plan view.

The respective protruding portions 60w are arranged side by side in the Y direction at predetermined intervals, and the end portions of the respective protruding portions 60w on the vapor pipe 30 side are away from the pipe wall of the evaporator 10. Then, the end portions of the respective protruding portions 60w on the vapor pipe 30 side are not connected to each other. On the other hand, the end portions of the respective protruding portions 60w on the liquid pipe 40 side are connected via the connection portion 60v. In other words, the porous body 60 in the evaporator 10 is formed in a comb-like shape having the connection portion 60v and the plurality of protrusions 60w in a plan view.

Within the evaporator 10, a space 80 is formed in an area where the porous body 60 is not provided. The space 80 are connected to a flow path 50 of the vapor pipe 30. The vapor Cv of the working fluid C flows through the space 80. The space 80 in the evaporator 10 is also a flow path 50.

The working fluid C is guided from the liquid pipe 40 side to the evaporator 10 and permeates the porous body 60. The working fluid C that has permeated the porous body 60 in the evaporator 10 is vaporized by heat generated in the heat generating component 120 to generate vapor Cv, and the vapor Cv flows through the space 80 in the evaporator 10 to the vapor pipe 30. It should be noted that although the number of protruding portions 60w (comb teeth) is seven in an example in FIG. 6 and FIG. 8, the number of protruding portions 60w (comb teeth) can be determined as appropriate. As the contact area between the protruding portions 60w and the space 80 increases, the working fluid C is easily evaporated, and pressure losses can be reduced.

The porous body 60 provided in the evaporator 10 is basically similar to the porous body 60 provided in the liquid pipe 40. For example, the positions of bottomed holes and pores that are formed in the metal layers 62 to 65 can be similar to those in FIG. 4 and FIG. 5.

In this manner, the porous body 60 is also provided in the evaporator 10. The liquid-phase working fluid C permeates part, which is close to the liquid pipe 40, of the porous body 60 of the evaporator 10. At this point, a capillary force acting on the working fluid C from the porous body 60 serves as a pumping force to circulate the working fluid C in the loop heat pipe 1.

In addition, this capillary force counters the vapor Cv in the evaporator 10. Therefore, it is possible to prevent the vapor Cv from reversely flowing into the liquid pipe 40.

Also, as illustrated in FIG. 6 to FIG. 8, within a first area 91 that overlaps with the space 80 of the evaporator 10, a plurality of recessed portions 71 are formed on the upper surface 1a and a plurality of recessed portions 76 are folioed on the lower surface 1b. As described above, the vapor Cv of the working fluid C flows through the space 80, and the space 80 in the evaporator 10 is also a flow path 50. The recessed portions 71 and 76 are respectively formed on the upper surface 1a and the lower surface 1b of the evaporator 10 so as not to overlap with the pipe walls (metal layers 62w to 65w) of the space 80 and the porous body 60 of the evaporator 10 in a plan view. In other words, the plurality of recessed portions 71 are formed in the first area 91 of the upper surface 61a of the metal layer 61 located directly above the space 80. Also, the plurality of recessed portions 76 are formed in the first area 91 of the lower surface 66a of the metal layer 66 located directly below the space 80. Then, the plurality of recessed portions 71 are not formed in the second and third areas 92 and 93 of the upper surface 61a of the metal layer 61 located directly above the pipe walls (metal layers 62w to 65w) of the space 80 and the porous body 60 of the evaporator 10. Also, the plurality of recessed portions 76 are not folioed in the second and third areas 92 and 93 of the lower surface 66a of the metal layer 66 located directly below the pipe walls (metal layers 62w to 65w) of the space 80 and the porous body 60 of the evaporator 10.

Figure 9:
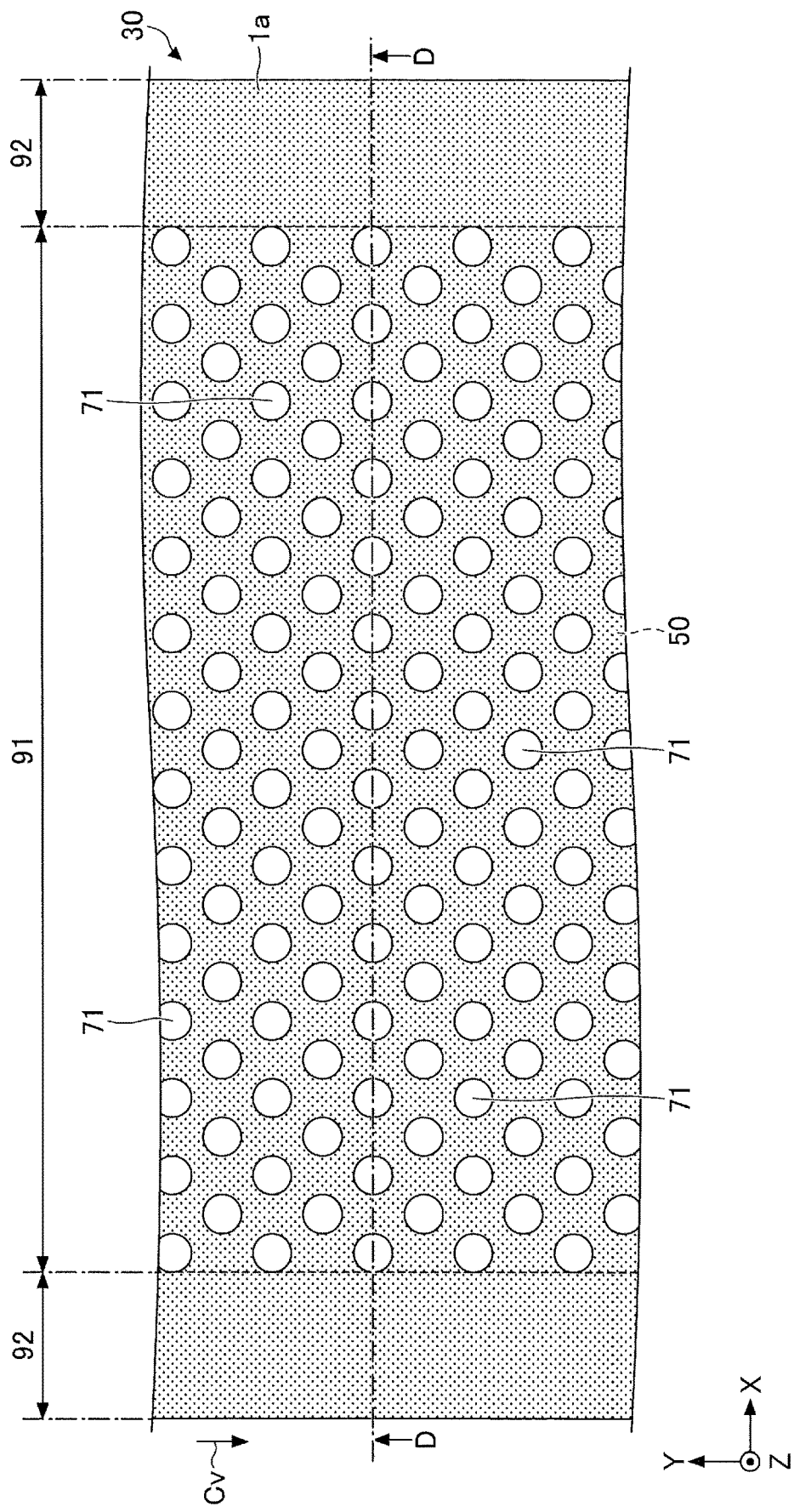
FIG. 9 is a plan view illustrating the vapor pipe according to the first embodiment.
Figure 10:
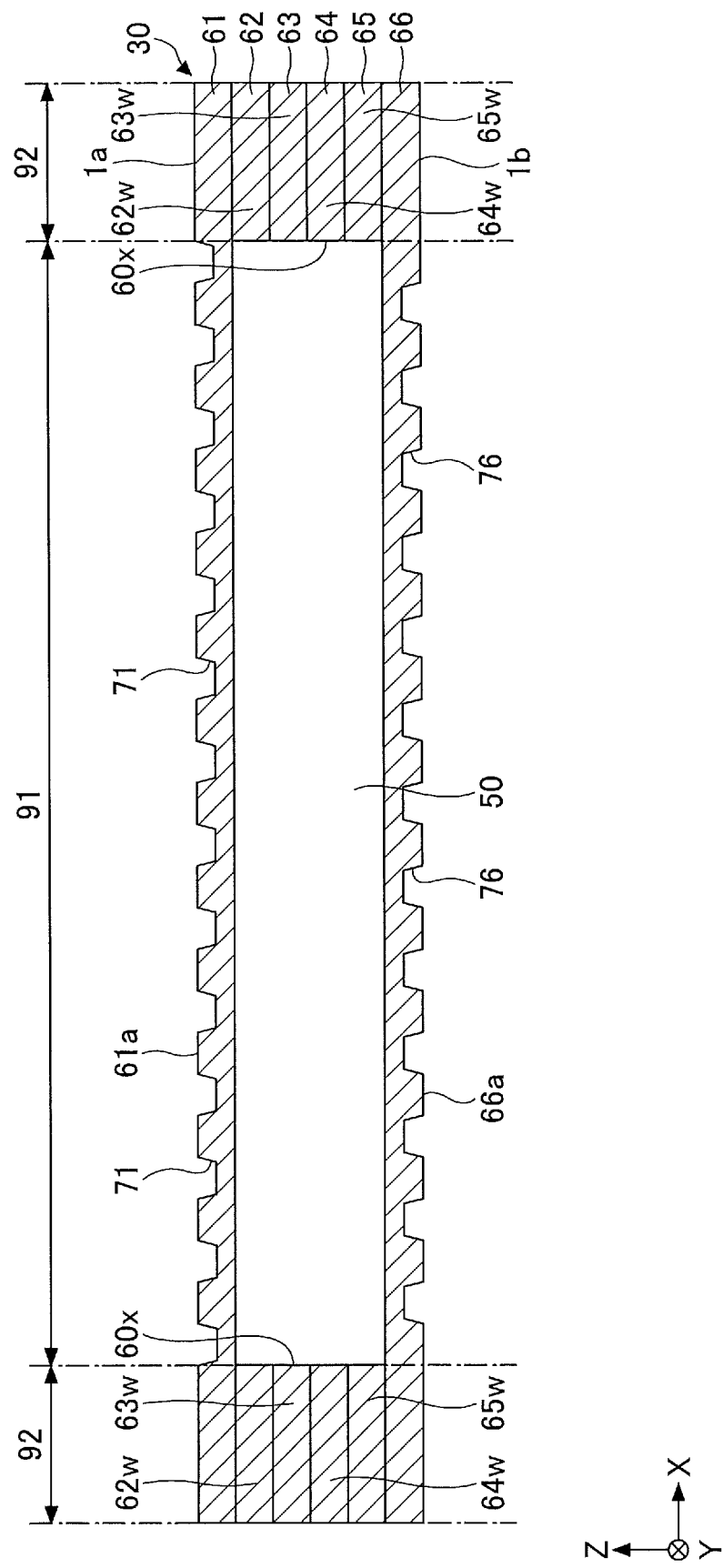
FIG. 10 is a cross-sectional view illustrating the vapor pipe according to the first embodiment.

FIG. 9 is a plan view illustrating the vapor pipe 30 according to the first embodiment, and FIG. 10 is a cross-sectional view illustrating the vapor pipe 30 according to the first embodiment. FIG. 10 illustrates a cross-section taken along the line D-D of FIG. 1 and FIG. 9. As illustrated in FIG. 10, there is no porous body 60 in the vapor pipe 30, and a flow path 50 is formed through which the vapor Cv of the working fluid C flows between both pipe wall surfaces 60x (the inner wall surfaces of the metal layers 62 to 65).

As illustrated in FIG. 9 and FIG. 10, a plurality of recessed portions 71 are formed on the upper surface 1a and a plurality of recessed portions 76 are formed on the lower surface 1b of the vapor pipe 30 also in the first area 91 that overlaps with the flow path 50 in a plan view. The recessed portions 71 and 76 are respectively formed on the upper surface 1a and the lower surface 1b of the vapor pipe 30 so as not to overlap with the pipe walls (metal layers 62w to 65w) of the flow path 50 of the vapor pipe 30 in a plan view. In other words, the plurality of recessed portions 71 are formed in the first area 91 of the upper surface 61a of the metal layer 61 located directly above the flow path 50 of the vapor pipe 30. Also, the plurality of recessed portions 76 also formed in the first area 91 of the lower surface 66a of the metal layer 66 located directly below the flow path 50 of the vapor pipe 30. Then, the plurality of recessed portions 71 are not formed in the second areas 92 of the upper surface 61a of the metal layer 61 located directly above the pipe walls (metal layer 62w to 65w) of the vapor pipe 30. Also, the plurality of recessed portions 76 are not formed in the second areas 92 of the lower surface 66a of the metal layer 66 located directly below the pipe walls (metal layer 62w to 65w) of the vapor pipe 30.

Similarly to the vapor pipe 30, in the condenser 20, there is no porous body 60, and a flow path 50 is formed through which the vapor Cv of the working fluid C or the working fluid C generated by condensed vapor CV flows between both pipe wall surfaces 60x (the inner wall surfaces of the metal layers 62 to 65). A plurality of recessed portions 71 are fa/lied on the upper surface 1a and a plurality of recessed portions 76 are formed on the lower surface 1b of the condenser 20 also in the first area 91 that overlaps with the flow path 50 in a plan view. The recessed portions 71 and 76 are respectively formed on the upper surface 1a and the lower surface 1b of the condenser 20 so as not to overlap with the pipe walls (metal layers 62w to 65w) of the flow path 50 of the condenser 20 in a plan view. In other words, the plurality of recessed portions 71 are famed in the first area 91 of the upper surface 61a of the metal layer 61 located directly above the flow path 50 of the condenser 20. Also, the plurality of recessed portions 76 also formed in the first area 91 of the lower surface 66a of the metal layer 66 located directly below the flow path 50 of the condenser 20. Then, the plurality of recessed portions 71 are not formed in the second areas 92 of the upper surface 61a of the metal layer 61 located directly above the pipe walls (metal layer 62w to 65w) of the condenser 20. Also, the plurality of recessed portions 76 are not formed in the second areas 92 of the lower surface 66a of the metal layer 66 located directly below the pipe walls (metal layer 62w to 65w) of the condenser 20.

[Method of Manufacturing Loop Heat Pipe According to the First Embodiment]

Next, a method of manufacturing the loop heat pipe 1 according to the first embodiment is described, focusing on the processes of manufacturing the porous body 60. FIGS. 11A to 11D through FIGS. 16A and 16B are diagrams illustrating processes of manufacturing the loop heat pipe 1 according to the first embodiment. FIGS. 11A to 11D, FIGS. 13A to 13D, and FIGS. 15A and 15B illustrate cross-sections corresponding to FIG. 4, and FIGS. 12A to 12D, FIGS. 14A to 14D, and FIGS. 16A and 16B illustrate cross-sections corresponding to FIG. 10.

Figure 12A:
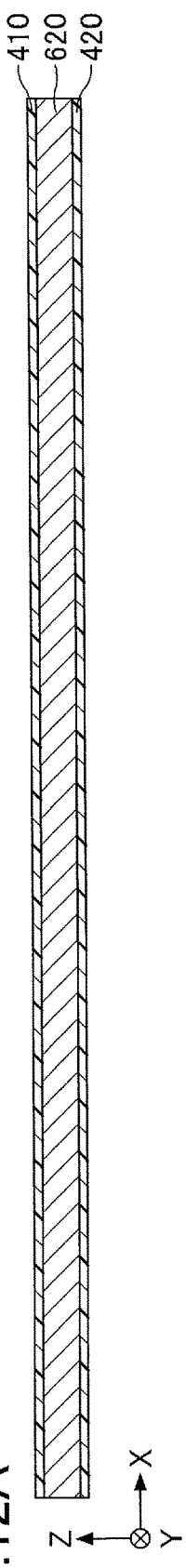
FIGS. 12A to 12D are drawings illustrating processes of manufacturing the loop heat pipe according to the first embodiment (part 2)

First, in the process illustrated in FIG. 11A and FIG. 12A, a metal sheet 620 so formed as to have a planar shape illustrated in FIG. 1 is prepared. Then, a resist layer 410 is formed on the upper surface of the metal sheet 620 and a resist layer 420 is formed on the lower surface of the metal sheet 620. The metal sheet 620, which is a member to ultimately become the metal layer 62, may be made of, for example, copper, stainless steel, aluminum, a magnesium alloy, or the like. The thickness of the metal sheet 620 may be, for example, approximately 50 μm to approximately 200 μm. For example, a photosensitive dry film resist or the like may be used as the resist layers 410 and 420.

Figure 12B:
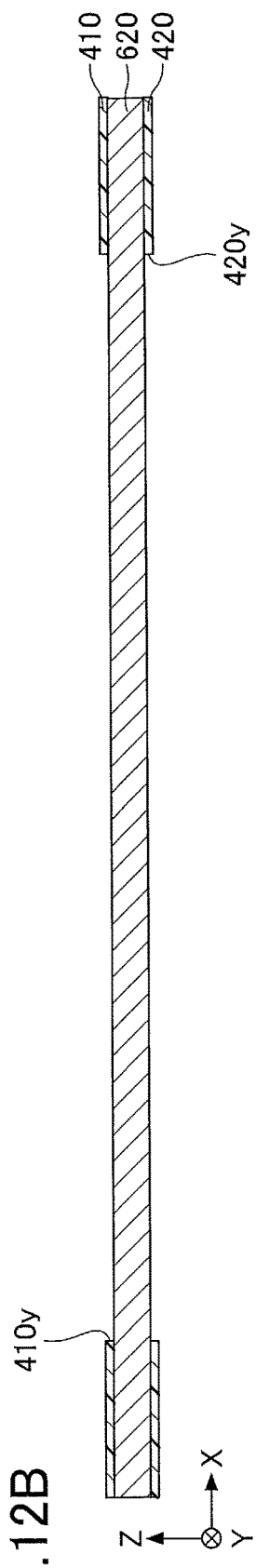

Next, in the process illustrated in FIG. 11B and FIG. 12B, on areas of the metal sheet 620 to forms the porous body 60 (an area to form the evaporator 10 and an area to form the liquid pipe 40), the resist layer 410 is exposed to light and developed to form opening portions 410x that selectively expose the upper surface of the metal sheet 620. Also, the resist layer 420 is exposed to light and developed to form opening portions 420x that selectively expose the lower surface of the metal sheet 620. The shapes and arrangement of the opening portions 410x and 420x are formed to correspond to the shapes and arrangement of the bottomed holes 62x and 62y illustrated in (a) of FIG. 5.

When the resist layer 410 is exposed to light and developed, in the area to form the flow path 50 of the metal sheet 620, an opening portion 410y is also formed to selectively expose the upper surface of the metal sheet 620. Also, when the resist layer 410 is exposed to light and developed, in the area to form the flow path 50 of the metal sheet 620, an opening portion 420y is also formed to selectively expose the lower surface of the metal sheet 620. The shape and arrangement of the opening portions 410y and 420y are formed to correspond to the shape and arrangement of the flow paths 50 illustrated in FIG. 4 and FIG. 10.

Figure 12C:

Next, in the process illustrated in FIG. 11C and FIG. 12C, the metal sheet 620, which is exposed in the opening portions 410x and 410y, is half etched from the upper surface side of the metal sheet 620, and the metal sheet 620, which is exposed in the opening portions 420x and 420y, is half etched from the lower surface side of the metal sheet 620. Thus, the bottomed holes 62x are famed on the upper surface side of the metal sheet 620, the bottomed holes 62y are formed on the lower surface side, and an opening portion 620x that penetrates the metal sheet 620 is formed. Further, because the opening portions 410x and the opening portions 420x alternately arranged in the X direction on the front and back sides overlap with each other in a plan view, the overlapping and communicating portions form the pores 62z. For half etching of the metal sheet 620, for example, a ferric chloride solution may be used.

Figure 12D:

Next, in the process illustrated in FIG. 11D and FIG. 12D, the resist layers 410 and 420 are removed using a stripping solution. As a result, the metal layer 62 is completed.

Also, in the process illustrated in FIG. 13A and FIG. 14A, a metal sheet 610 so formed as to have a planar shape illustrated in FIG. 1 is prepared. Then, a resist layer 310 is formed on the upper surface of the metal sheet 610 and a resist layer 320 is formed on the lower surface of the metal sheet 610. The metal sheet 610, which is a member to ultimately become the metal layer 61, may be made of, for example, copper, stainless steel, aluminum, a magnesium alloy, or the like. The thickness of the metal sheet 610 may be, for example, approximately 50 μm to approximately 200 μm. For example, a photosensitive dry film resist or the like may be used as the resist layers 310 and 320.

Next, in the process illustrated in FIG. 13B and FIG. 14B, in the areas (first areas 91) of the metal sheet 610 where the recessed portions 71 are to be formed, the resist layer 310 is exposed to light and developed to form opening portions 310z that selectively expose the upper surface of the metal sheet 610. The shape and arrangement of the opening portions 310z are formed to correspond to the shape and arrangement of the recessed portions 71 illustrated in FIG. 3 and FIG. 9. The resist layer 310 on which the opening portions 310z are formed is an example of a mask, which covers, for example, portions to form the second and third areas.

Next, in the process illustrated in FIG. 13C and FIG. 14C, the metal sheet 610 that is exposed in the opening portions 310z is half etched from the upper surface side of the metal sheet 610. Thereby, the recessed portions 71 of bottomed holes are formed on the upper surface side of the metal sheet 610. For the half etching of the metal sheet 610, for example, a ferric chloride solution may be used.

Next, in the process illustrated in FIG. 13D and FIG. 14D, the resist layers 310 and 320 are removed using a stripping solution. As a result, the metal layer 61 is completed.

Figure 16A:
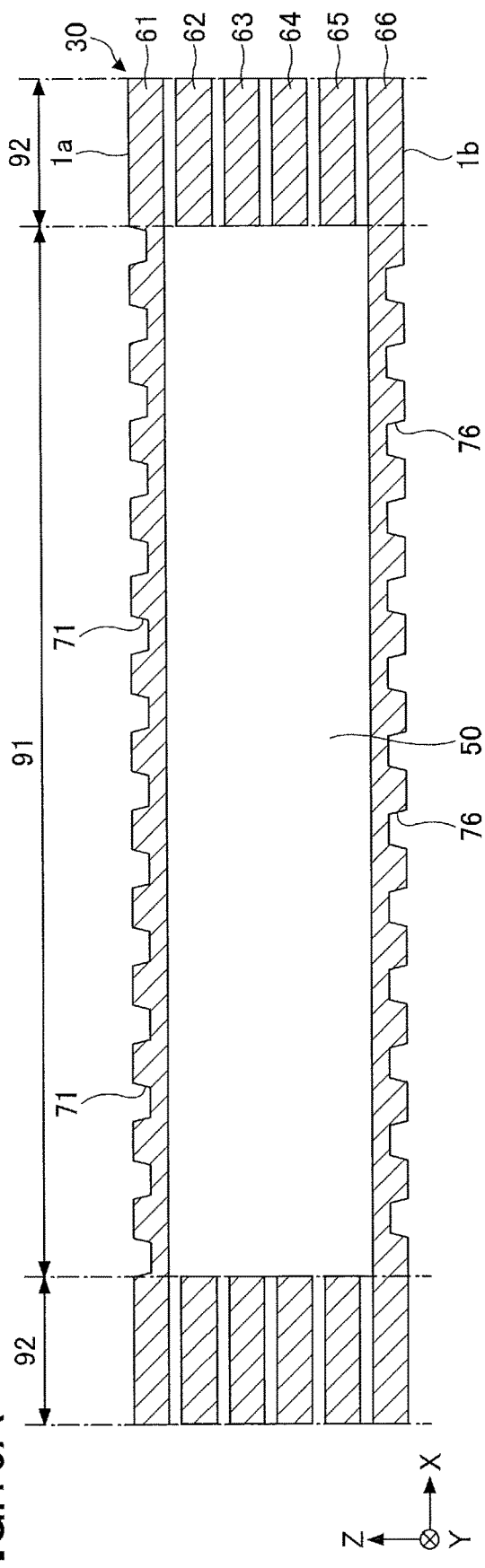
FIGS. 16A and 16B are drawings illustrating processes of manufacturing the loop heat pipe according to the first embodiment (part 6)

Next, in the process illustrated in FIG. 15A and FIG. 16A, the metal layer 66 is formed in a manner similar to the metal layer 61, and the metal layers 63, 64, and 65 are formed in a manner similar to the metal layer 62. The positions of the bottomed holes and the pores formed on the metal layers 63, 64, and 65 are as illustrated in FIG. 5, for example.

Figure 16B:
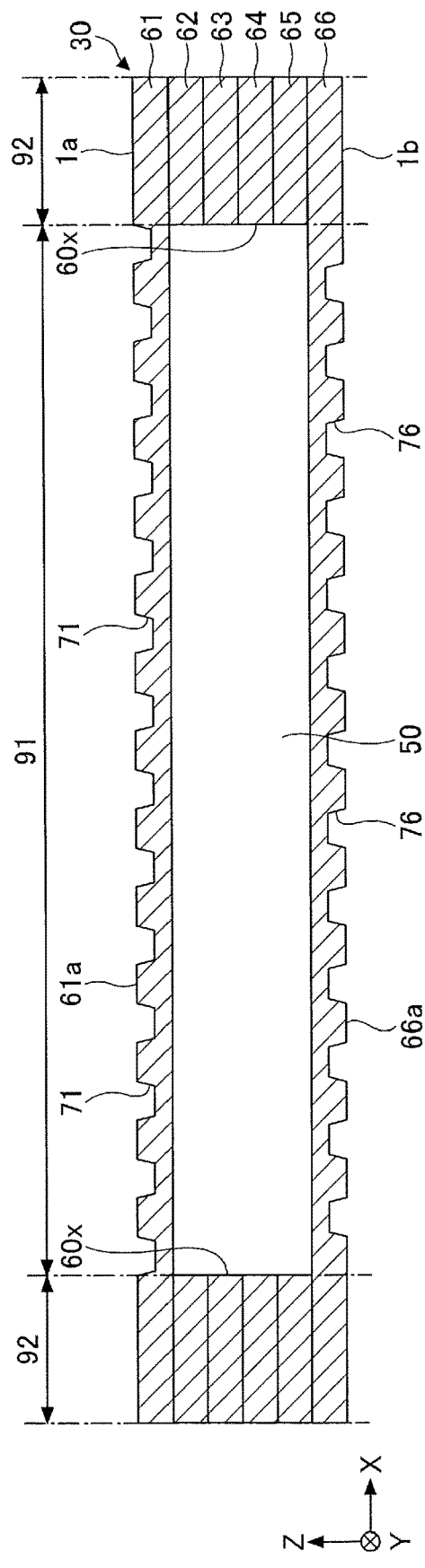

Next, in the process illustrated in FIG. 15B and FIG. 16B, the respective metal layers are layered in the order illustrated in FIG. 15A and FIG. 16A, and are joined by solid-state welding through application of pressure and heat. As a result, adjacent metal layers are directly joined to each other, the loop heat pipe 1 including the evaporator 10, the condenser 20, the vapor pipe 30, and the liquid pipe 40 is completed, and the porous body 60 is formed in the evaporator 10 and the liquid pipe 40. Also, the space 80 is formed in the evaporator 10, and the flow paths 50 are formed in the condenser 20, the vapor pipe 30, and the liquid pipe 40. Thereafter, the liquid pipe 40 is evacuated using a vacuum pump or the like, and the working fluid C is thereafter injected into the liquid pipe 40 from an inlet port (not illustrated). Thereafter, the inlet port is sealed.

Here, the solid-state welding refers to a method of joining work pieces together by heating and softening the work pieces in solid phase (solid state) without melting the work pieces and plastically deforming the work pieces by further applying pressure. It should be noted that the metal layers 61 to 66 are preferably made of the same material so that adjacent metal layers can be satisfactorily joined together by solid-state welding.

In the first embodiment, in the first areas 91 of the evaporator 10, the condenser 20, the vapor pipe 30, and the liquid pipe 40, the plurality of recessed portions 71 are formed on the upper surface 1a and the plurality of recessed portions 76 are formed on the lower surface 1b. Accordingly, in comparison to a case where the upper surface 1a and the lower surface 1b are flat surfaces without recessed portions 71 and 76, the contact area with outside air is larger, and the heat dissipation efficiency can be enhanced.

Also, the recessed portions 71 and 76 are not formed in the second and third areas 92 and 93. Accordingly, in manufacturing the loop heat pipe 1, when the respective metal layers are layered and are joined by solid-state welding through application of pressure and heat, it is possible to sufficiently apply pressure from the outside to the layered structure of the metal layers at both the second and third areas 92 and 93. Therefore, it is possible to secure sufficient airtightness at the pipe wall and to secure a desired capillary force at the porous body.

Modified Example of the First Embodiment

A modified example of the first embodiment indicates an example in which porous bodies are provided in contact with the pipe walls in a liquid pipe. It should be noted that in the modified example of the first embodiment, descriptions of constituent elements that are the same as those of the embodiment previously described may be omitted as appropriate.

Figure 18:
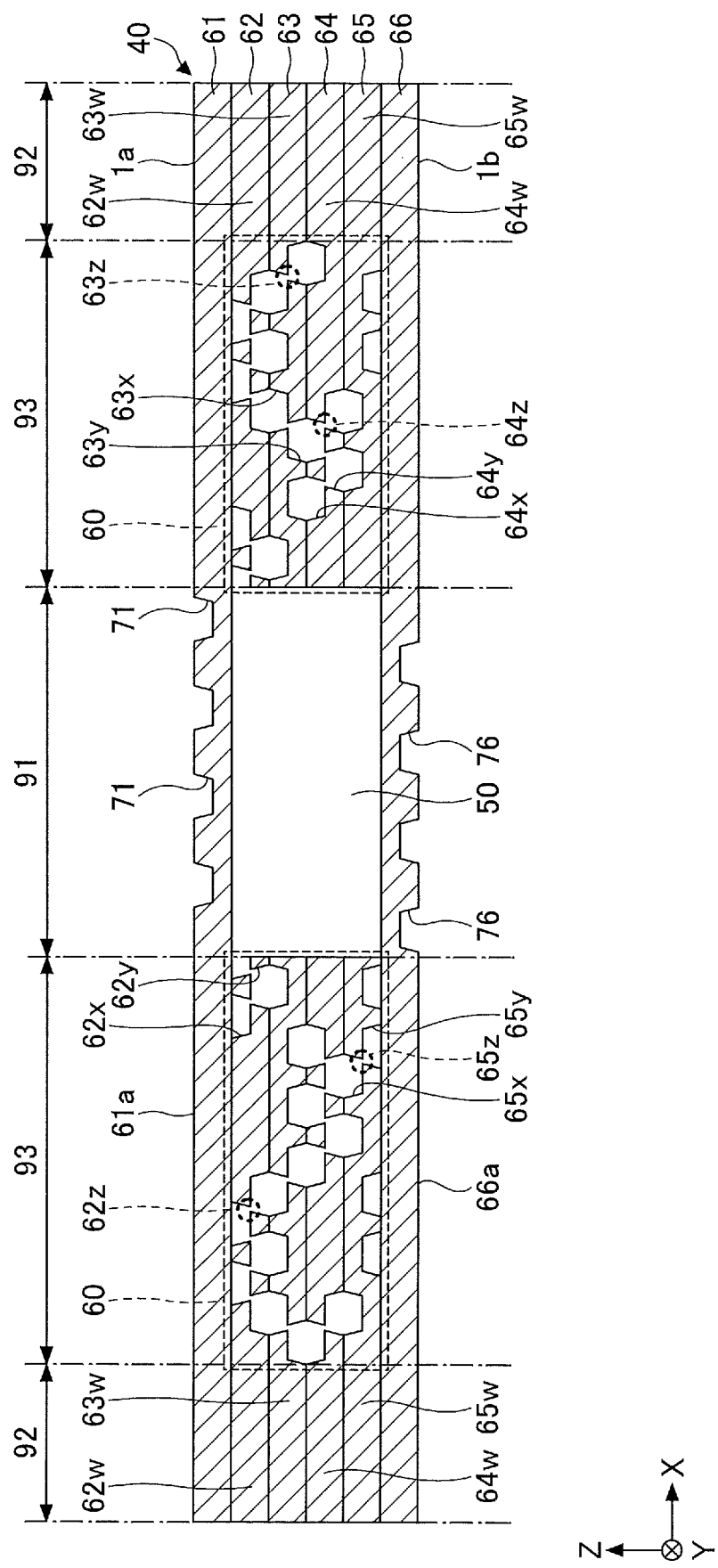
FIG. 18 is a cross-sectional view illustrating the liquid pipe and porous bodies in the liquid pipe according to the modified example of the first embodiment.

FIG. 17 is a plan view illustrating a liquid pipe 40 according to a modified example of the first embodiment, and FIG. 18 is a cross-sectional view illustrating the liquid pipe 40 and porous bodies in the liquid pipe 40 according to the modified example of the first embodiment. FIG. 18 illustrates a cross-section taken along the line B-B of FIG. 1 and FIG. 17. As illustrated in FIG. 17 and FIG. 18, two porous bodies 60 are provided in the liquid pipe 40. One porous body 60 is formed in continuous with one pipe wall of the liquid pipe 40, and the other porous body 60 is formed in continuous with the other pipe wall of the liquid pipe 40. Then, between the surface of the one porous body 60 facing the other porous body 60 and the surface of the other porous body 60 facing the one porous body 60, a flow path 50 through which a working fluid C flows is formed.

As illustrated in FIG. 17 and FIG. 18, two third areas 93 are located between two second areas 92 and a first area 91 is located between the two third areas 93. Then, within the first area 91, a plurality of recessed portions 71 are formed on the upper surface 1a of the liquid pipe 40 and a plurality of recessed portions 76 are formed on the lower surface 1b of the liquid pipe 40. The recessed portions 71 and 76 are respectively formed on the upper surface 1a and the lower surface 1b of the liquid pipe 40 so as not to overlap with the pipe walls (metal layers 62w to 65w) of the flow path 50 of the liquid pipe 40 and the porous bodies 60 in a plan view. In other words, the plurality of recessed portions 71 are formed in the first area 91 of the upper surface 61a of the metal layer 61 located directly above the flow path 50 of the liquid pipe 40. Also, the plurality of recessed portions 76 are formed in the first area 91 of the lower surface 66a of the metal layer 66 located directly below the flow path 50 of the liquid pipe 40. Then, the plurality of recessed portions 71 are not formed in the second areas 92 and the third areas 93 of the upper surface 61a of the metal layer 61 located directly above the pipe walls (the metal layer 62w to 65w) of the flow path 50 of the liquid pipe 40 and the porous bodies 60. Also, the plurality of recessed portions 76 are not formed in the second areas 92 and the third areas 93 of the lower surface 66a of the metal layer 66 located directly below the pipe walls (the metal layer 62w to 65w) of the flow path 50 of the liquid pipe 40 and the porous bodies 60.

Other configurations are similar to those of the first embodiment.

Effects similar to those of the first embodiment can be also obtained by the modified example.

It should be noted in the first embodiment and its modified example, the diameters and depths of the recessed portions 71 and 76 may not be uniform. For example, with decreasing distance to the third area 93, that is, with decreasing distance to the porous body 60, the recessed portions 71 and 76 may decrease in diameter and depth. In a case in which the recessed portions 71 and 76 decrease in diameter and depth with distance decreasing to the third area 93, it is easier to more reliably apply a pressure from outside to the metal layers that form the porous body 60, in the vicinity of the boundary between the third area 93 and the first area 91.

Second Embodiment

The second embodiment differs from the first embodiment mainly in terms of the configuration of recessed portions. It should be noted that in the second embodiment, descriptions of constituent elements that are the same as those of the embodiment previously described may be omitted as appropriate.

Figure 19:
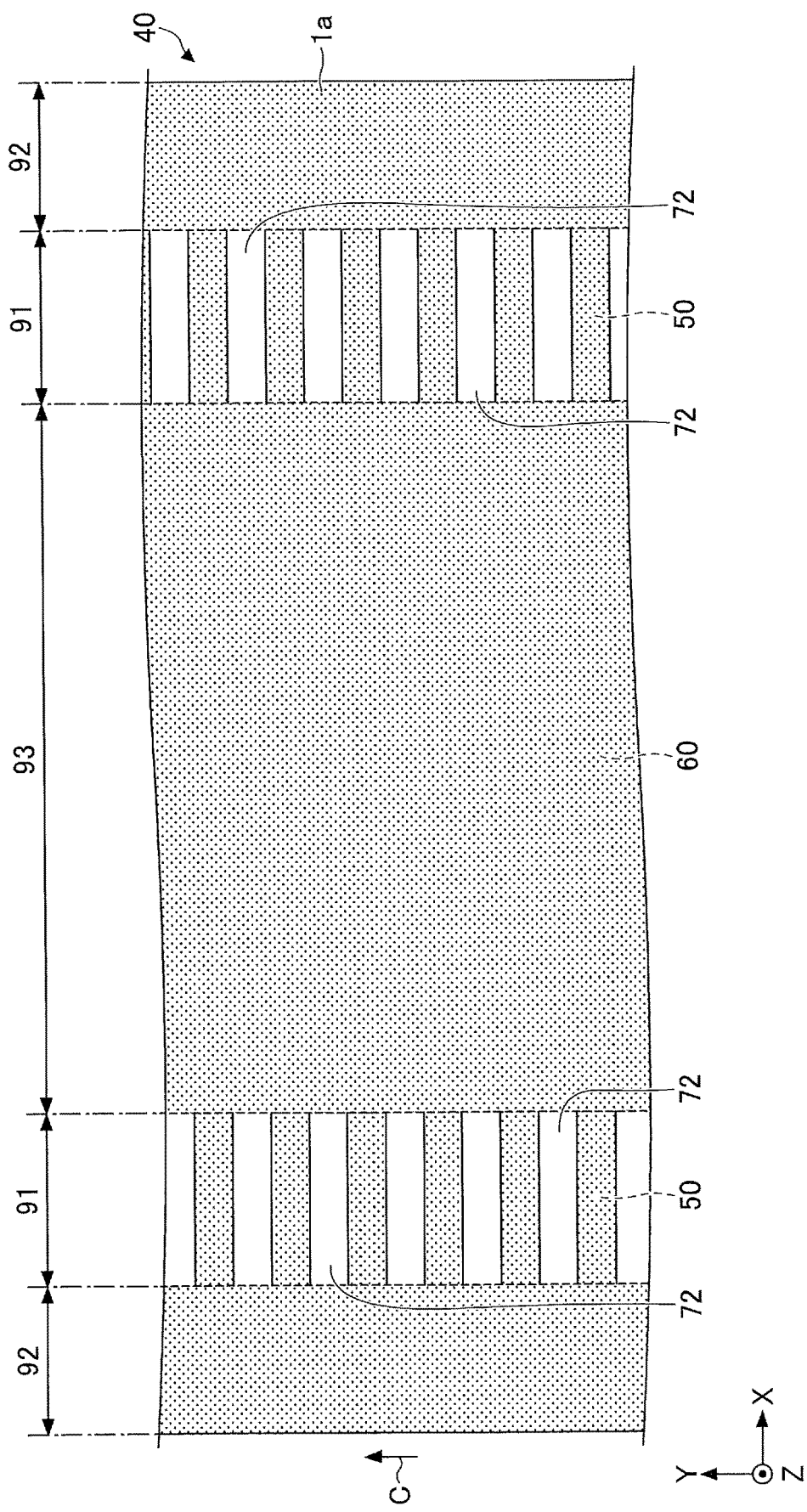
FIG. 19 is a plan view illustrating a liquid pipe according to a second embodiment.

FIG. 19 is a plan view illustrating a liquid pipe 40 according to the second embodiment. In the second embodiment, instead of the plurality of recessed portions 71, within the first areas 91, a plurality of recessed portions 72 are formed on the upper surface 1a of the liquid pipe 40 (upper surface 61a of the metal layer 61). The recessed portions 72 are formed, for example, in a groove shape extending in a direction (X direction) perpendicular to the direction (Y direction) in which the working fluid C flows in the flow paths 50 that overlap with the recessed portions 72. An angle when the X direction and Y direction intersect can be set as appropriate. The recessed portions 72 are, for example, bottomed grooves that are recessed from the upper surface side to the substantially central portion in the thickness direction. A width of the recessed portions 72 may be, for example, approximately 50 μm to approximately 300 μm. A depth of the recessed portions 72 may be, for example, about half the thickness of the metal layer 61. An interval between the adjacent recessed portions 72 may be, for example, approximately 50 μm to approximately 300 μm. The recessed portions 72 may be uniformly or non-uniformly spaced.

Although not illustrated, instead of the plurality of recessed portions 76, within the first areas 91, a plurality of recessed portions are formed on the lower surface 1b of the liquid pipe 40 (lower surface 66a of the metal layer 61) in a manner similar to the recessed portions 72. That is, these recessed portions are formed, for example, in a groove shape extending in a direction (X direction) perpendicular to the direction (Y direction) in which the working fluid C flows in the flow paths 50 that overlap with the recessed portions, and are bottomed grooves that are recessed from the upper surface side to the substantially central portion in the thickness direction. In the following, the recessed portions 72 and the recessed portions formed on the lower surface 1b in the second embodiment are collectively referred to as recessed portions such as the recessed portions 72.

The inner walls of the recessed portions such as the recessed portions 72 can be tapered to widen from the bottom surface side toward the opening portion side. However, the inner walls of the recessed portions such as the recessed portions 72 are not limited to a tapered shape, and may be perpendicular to the bottom surface.

As illustrated in FIG. 19, the recessed portions such as the recessed portions 72 are not formed in the second areas 92 and the third area 93 of the upper surface 1a and the lower surface 1b of the liquid pipe 40. That is, the recessed portions such as the recessed portions 72 are formed on the upper surface 1a and the lower surface 1b of the liquid pipe 40 so as not to overlap with the pipe walls (metal layers 62w to 65w) of the flow paths 50 and the porous body 60 of the liquid pipe 40 in a plan view.

On the evaporator 10, the recessed portions such as the recessed portions 72 may also be formed instead of the recessed portions 71 and 76. The recessed portions such as the recessed portions 72 are not formed in the second and third areas 92 and 93 of the upper surface 1a and the lower surface 1b of the evaporator 10. That is, the recessed portions such as the recessed portions 72 are formed on the upper surface 1a and the lower surface 1b of the evaporator 10 so as not to overlap with the pipe walls (metal layers 62w to 65w) of the space 80 and the porous body 60 of the evaporator 10 in a plan view.

Figure 20:
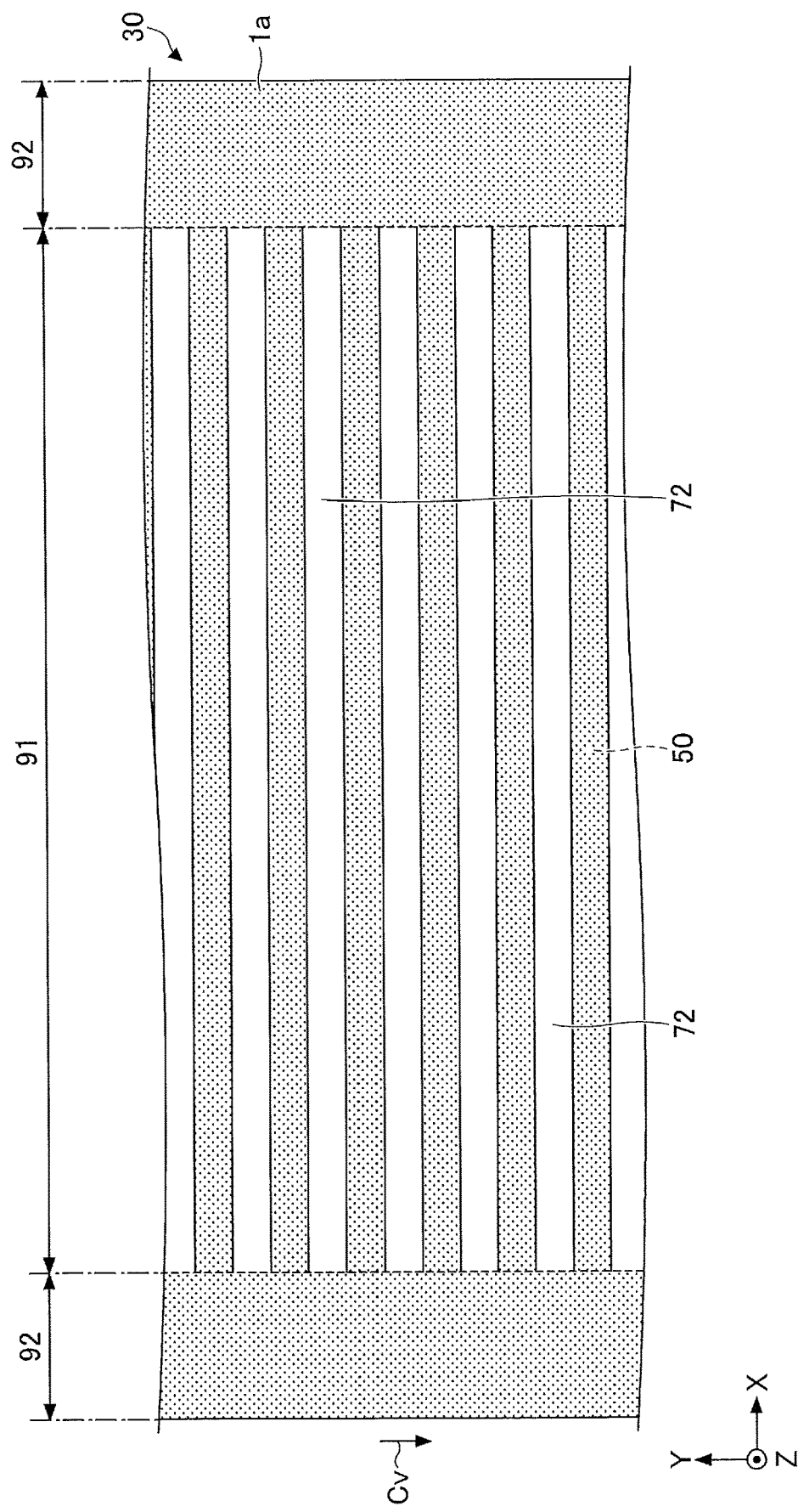
FIG. 20 is a plan view illustrating a vapor pipe according to the second embodiment.

FIG. 20 is a plan view illustrating a vapor pipe 30 according to the second embodiment. Within the first area 91 that overlaps with the flow path 50 in a plan view of the vapor pipe 30, instead of the plurality of recessed portions 71, a plurality of recessed portions 72 are formed on the upper surface 1a of the vapor pipe 30 (the upper surface 61a of the metal layer 61). Also, although not illustrated, instead of the plurality of recessed portions 76, a plurality of recessed portions are formed on the lower surface 1b of the vapor pipe 30 (lower surface 66a of the metal layer 66) in a manner similar to the recessed portions 72. The recessed portions such as the recessed portions 72 are not formed in the second areas 92 of the upper surface 1a and the lower surface 1b of the vapor pipe 30. That is, the recessed portions such as the recessed portions 72 are formed on the upper surface 1a and the lower surface 1b of the vapor pipe 30 so as not to overlap with the pipe walls (metal layers 62w to 65w) of the flow path 50 of the vapor pipe 30 in a plan view.

On the condenser 20, instead of the recessed portions 71 and 76, the recessed portions such as the recessed portions 72 may also be formed in a first area 91 that overlaps with the flow path 50 in a plan view of the condenser 20. The recessed portions such as the recessed portions 72 are not formed in the second areas 92 of the upper surface 1a and the lower surface 1b of the condenser 20. That is, the recessed portions such as the recessed portions 72 are formed on the upper surface 1a and the lower surface 1b of the condenser 20 so as not to overlap with the pipe walls (metal layers 62w to 65w) of the flow path 50 of the condenser 20 in a plan view.

Other configurations are similar to those of the first embodiment.

Effects similar to those of the first embodiment can be also obtained by the second embodiment.

Modified Example of the Second Embodiment

A modified example of the second embodiment indicates an example in which porous bodies are provided in contact with the pipe walls in a liquid pipe. It should be noted that in the modified example of the second embodiment, descriptions of constituent elements that are the same as those of the embodiment previously described may be omitted as appropriate.

Figure 21:
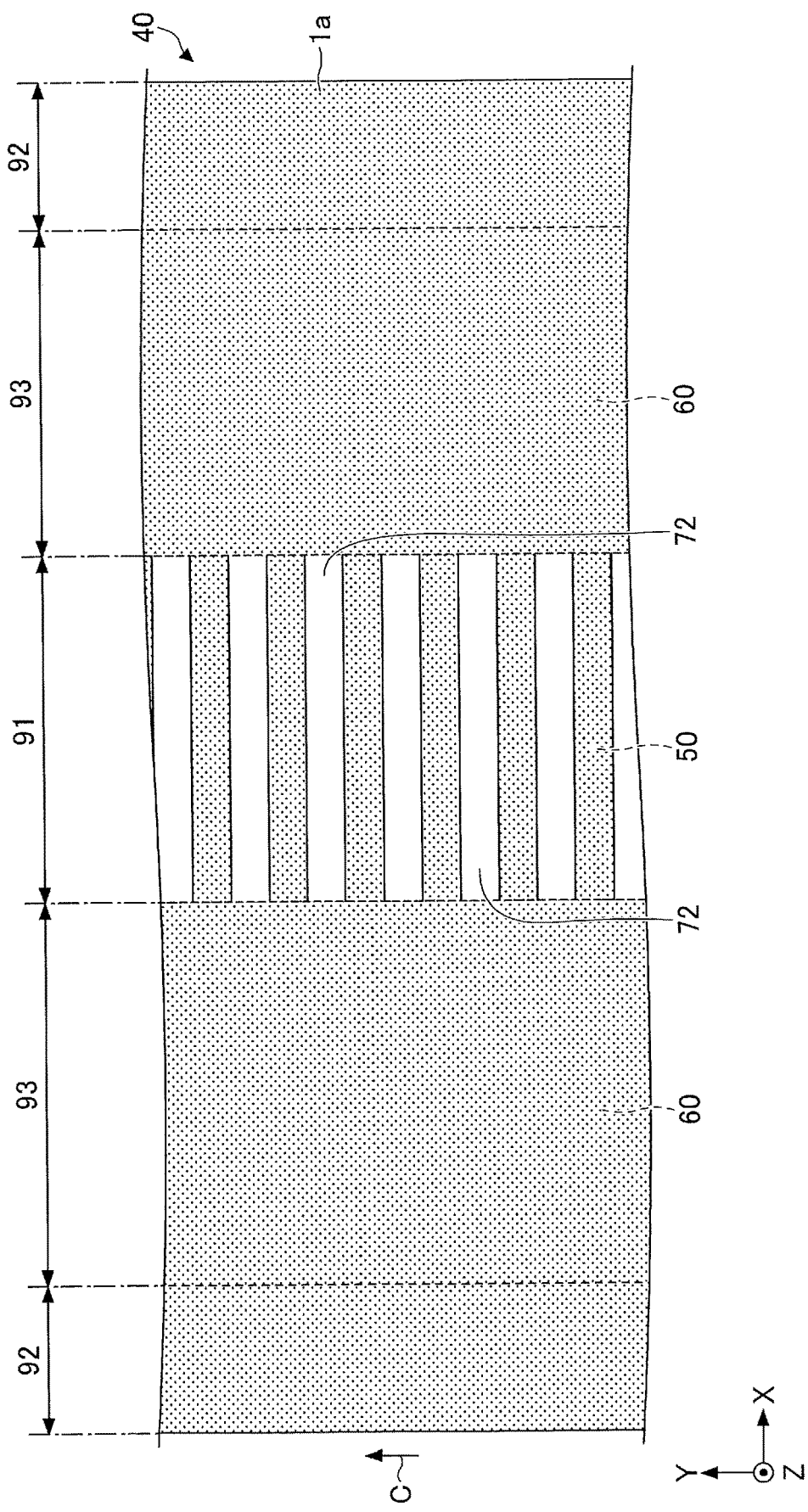
FIG. 21 is a plan view illustrating a liquid pipe according to a modified example of the second embodiment.

FIG. 21 is a plan view illustrating a liquid pipe 40 according to a modified example of the second embodiment. As illustrated in FIG. 21, similarly to the modified example of the first embodiment, two third areas 93 are located between two second areas 92 and a first area 91 is located between the two third areas 93. Then, within the first area 91, a plurality of recessed portions 72 are formed on the upper surface 1a of the liquid pipe 40 (upper surface 61a of the metal layer 61). Also, although not illustrated, a plurality of recessed portions are formed on the lower surface 1b of the liquid pipe 40 (lower surface 66a of the metal layer 66) in a manner similar to the recessed portions 72. The recessed portions such as the recessed portions 72 are not formed in the second areas 92 and the third areas 93 of the upper surface 1a and the lower surface 1b of the liquid pipe 40. That is, the recessed portions such as the recessed portions 72 are formed on the upper surface 1a and the lower surface 1b of the liquid pipe 40 so as not to overlap with the pipe walls (metal layers 62w to 65w) of the flow path 50 and porous bodies 60 of the liquid pipe 40 in a plan view.

Other configurations are similar to those of the second embodiment.

Effects similar to those of the second embodiment can be also obtained by the modified example.

It should be noted in the second embodiment and its modified example, the diameters and depths of the recessed portions such as the recessed portions 72 may not be uniform. For example, with decreasing distance to the third area 93, that is, with decreasing distance to the porous body 60, the recessed portion may decrease in width and depth. In a case in which the recessed portion decreases in width and depth with distance decreasing to the third area 93, it is easier to more reliably apply a pressure from outside to the metal layers that form the porous body 60, in the vicinity of the boundary between the third area 93 and the first area 91.

Third Embodiment

The third embodiment differs from the first embodiment mainly in terms of the configuration of recessed portions. It should be noted that in the third embodiment, descriptions of constituent elements that are the same as those of the embodiment previously described may be omitted as appropriate.

Figure 22:
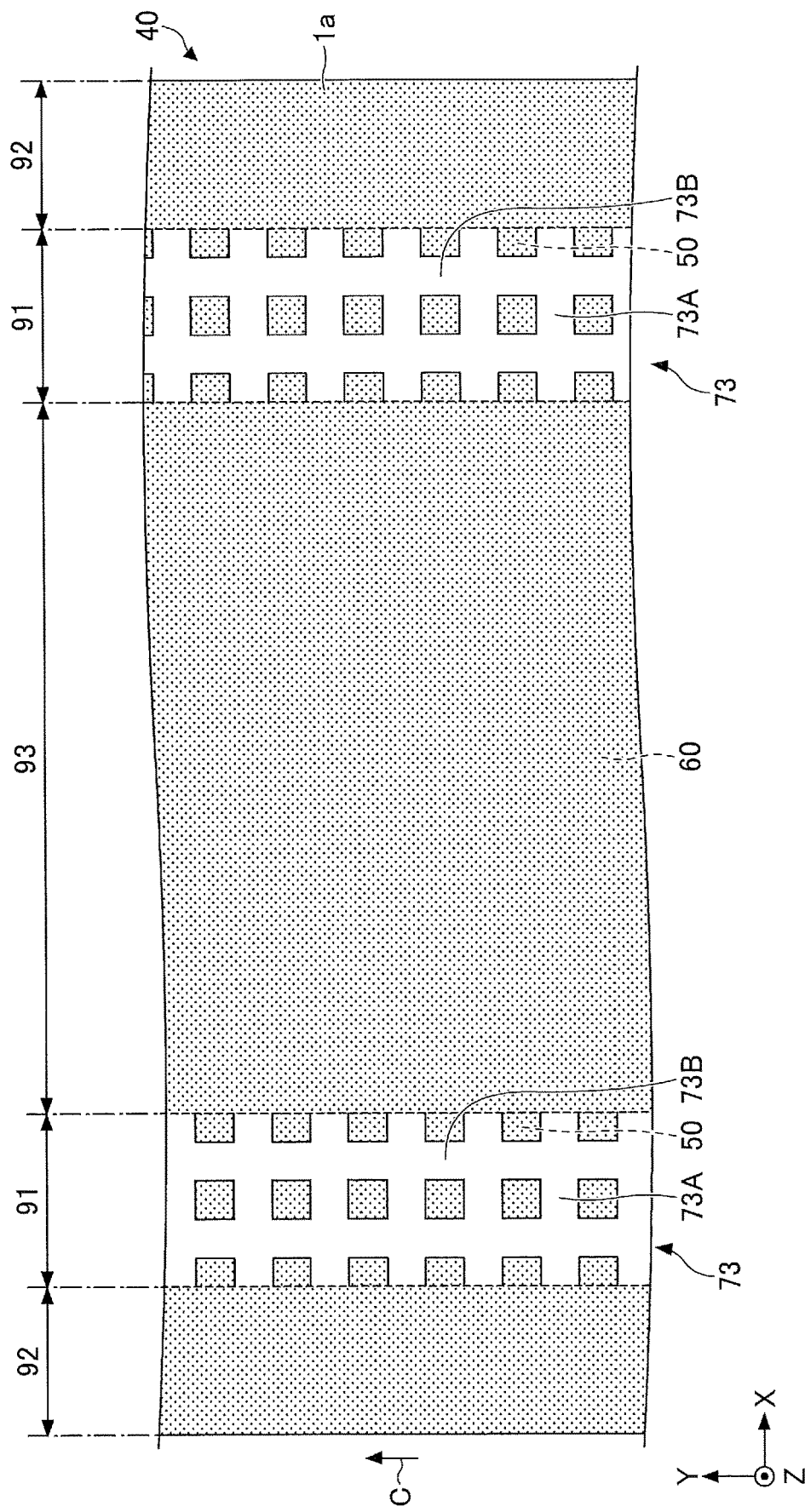
FIG. 22 is a plan view illustrating a liquid pipe according to a third embodiment.

FIG. 22 is a plan view illustrating a liquid pipe according to the third embodiment. In the third embodiment, instead of the plurality of recessed portions 71, within the respective first areas 91, recessed portions 73 are formed on the upper surface 1a of the liquid pipe 40 (upper surface 61a of the metal layer 61). The recessed portions 73 each include a plurality of recessed portions 73A and a plurality of recessed portions 73B intersecting each other in a plan view. The recessed portions 73A are formed, for example, in a groove shape extending in a direction (X direction) perpendicular to the direction (Y direction) in which the working fluid C flows in the flow paths 50 that overlap with the recessed portions 73A. The recessed portions 73B are formed, for example, in a groove shape extending in parallel with the direction (Y direction) in which the working fluid C flows in the flow paths 50 that overlap with the recessed portions 73A. The recessed portions 73 are, for example, bottomed grooves that are recessed from the upper surface side to the substantially central portion in the thickness direction. A depth of the recessed portions 73A and 73B may be, for example, approximately 50 μm to approximately 300 μm. A depth of the recessed portions 73A and 73B may be, for example, about half the thickness of the metal layer 61. An interval between the adjacent recessed portions 73A and an interval between the adjacent recessed portions 73B may be, for example, approximately 50 μm to approximately 300 μm. The recessed portions 73A may be uniformly or non-uniformly spaced. The recessed portions 73B may be uniformly or non-uniformly spaced.

Although not illustrated, instead of the plurality of recessed portions 76, within the respective first areas 91, recessed portions are formed on the lower surface 1b of the liquid pipe 40 (lower surface 66a of the metal layer 61) in a manner similar to the recessed portions 73. That is, for example, the formed recessed portions each include a plurality of recessed portions intersecting each other in a plan view, and the plurality of recessed portions are formed in a groove shape and are bottomed grooves that are recessed from the lower surface side to the substantially central portion in the thickness direction. In the following, the recessed portions 73 and the recessed portions formed on the lower surface 1b in the third embodiment are collectively referred to as recessed portions such as the recessed portions 73.

The inner walls of the recessed portions such as the recessed portions 73 can be tapered to widen from the bottom surface side toward the opening portion side. However, the inner walls of the recessed portions such as the recessed portions 73 are not limited to a tapered shape, and may be perpendicular to the bottom surface.

As illustrated in FIG. 22, the recessed portions such as the recessed portions 73 are not famed in the second areas 92 and the third area 93 of the upper surface 1a and the lower surface 1b of the liquid pipe 40. That is, the recessed portions such as the recessed portions 73 are formed on the upper surface 1a and the lower surface 1b of the liquid pipe 40 so as not to overlap with the pipe walls (metal layers 62w to 65w) of the flow paths 50 and the porous body 60 of the liquid pipe 40 in a plan view.

On the evaporator 10, the recessed portions such as the recessed portions 73 may also be formed instead of the recessed portions 71 and 76. The recessed portions such as the recessed portions 73 are not formed in the second and third areas 92 and 93 of the upper surface 1a and the lower surface 1b of the evaporator 10. That is, the recessed portions such as the recessed portions 73 are formed on the upper surface 1a and the lower surface 1b of the evaporator 10 so as not to overlap with the pipe walls (metal layers 62w to 65w) of the space 80 and the porous body 60 of the evaporator 10 in a plan view.

Figure 23:
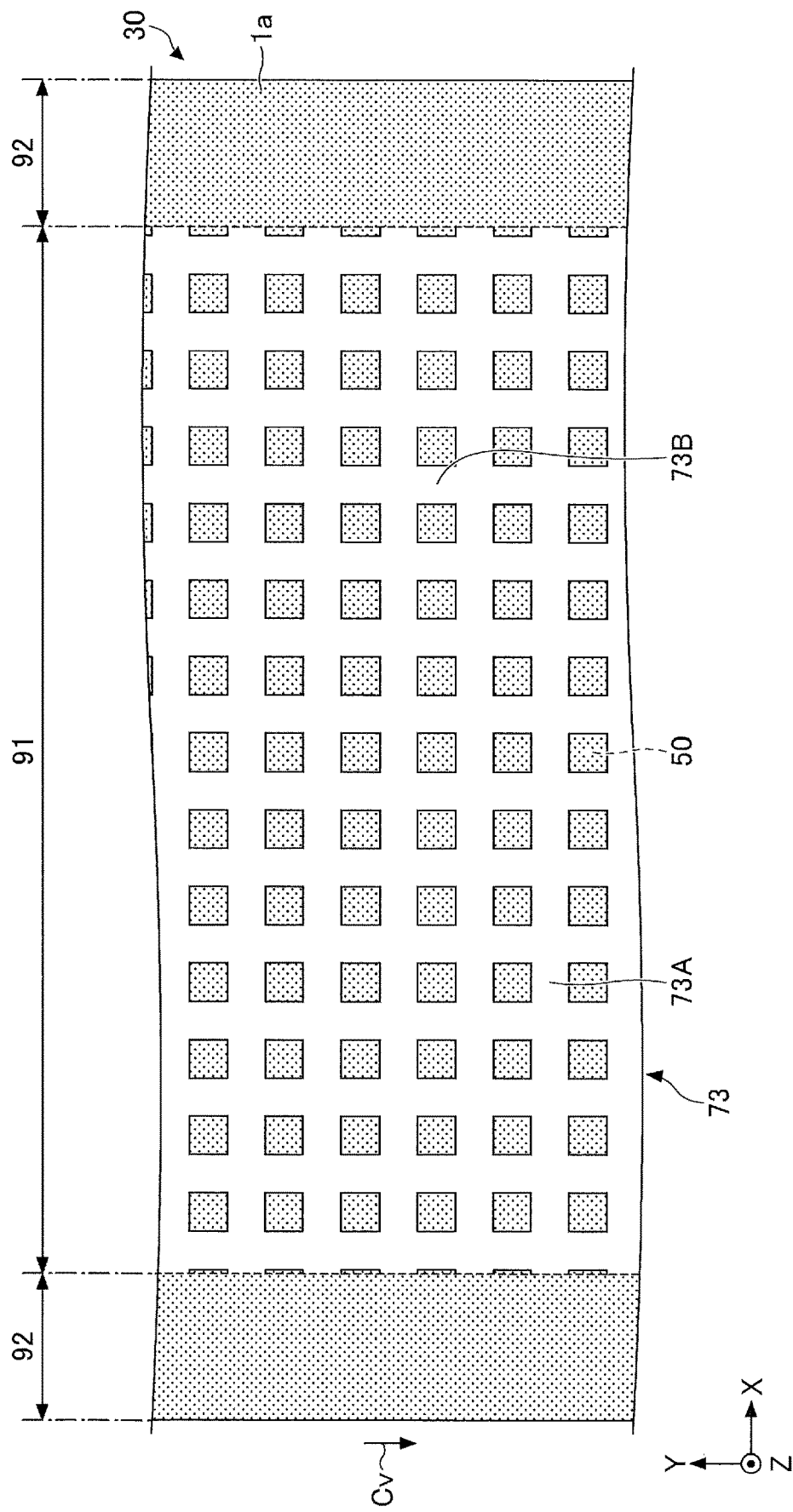
FIG. 23 is a plan view illustrating a vapor pipe according to a third embodiment.

FIG. 23 is a plan view illustrating a vapor pipe 30 according to the third embodiment. Within the first area 91 that overlaps with the flow path 50 in a plan view of the vapor pipe 30, instead of the plurality of recessed portions 71, a recessed portion 73 is formed on the upper surface 1a of the vapor pipe 30 (the upper surface 61a of the metal layer 61). Also, although not illustrated, instead of the plurality of recessed portions 76, a recessed portion is formed on the lower surface 1b of the vapor pipe 30 (lower surface 66a of the metal layer 66) in a manner similar to the recessed portion 73. The recessed portions such as the recessed portion 73 are not formed in the second areas 92 of the upper surface 1a and the lower surface 1b of the vapor pipe 30. That is, the recessed portions such as the recessed portion 73 are formed on the upper surface 1a and the lower surface 1b of the vapor pipe 30 so as not to overlap with the pipe walls (metal layers 62w to 65w) of the flow path 50 of the vapor pipe 30 in a plan view.

On the condenser 20, instead of the recessed portions 71 and 76, the recessed portions such as the recessed portion 73 may also be formed in a first area 91 that overlaps with the flow path 50 in a plan view of the condenser 20. The recessed portions such as the recessed portion 73 are not formed in the second areas 92 of the upper surface 1a and the lower surface 1b of the condenser 20. That is, the recessed portions such as the recessed portion 73 are formed on the upper surface 1a and the lower surface 1b of the condenser 20 so as not to overlap with the pipe walls (metal layers 62w to 65w) of the flow path 50 of the condenser 20 in a plan view.

Other configurations are similar to those of the first embodiment.

Effects similar to those of the first embodiment can be also obtained by the third embodiment.

Modified Example of the Third Embodiment

A modified example of the third embodiment indicates an example in which porous bodies are provided in contact with the pipe walls in a liquid pipe. It should be noted that in the modified example of the third embodiment, descriptions of constituent elements that are the same as those of the embodiment previously described may be omitted as appropriate.

Figure 24:
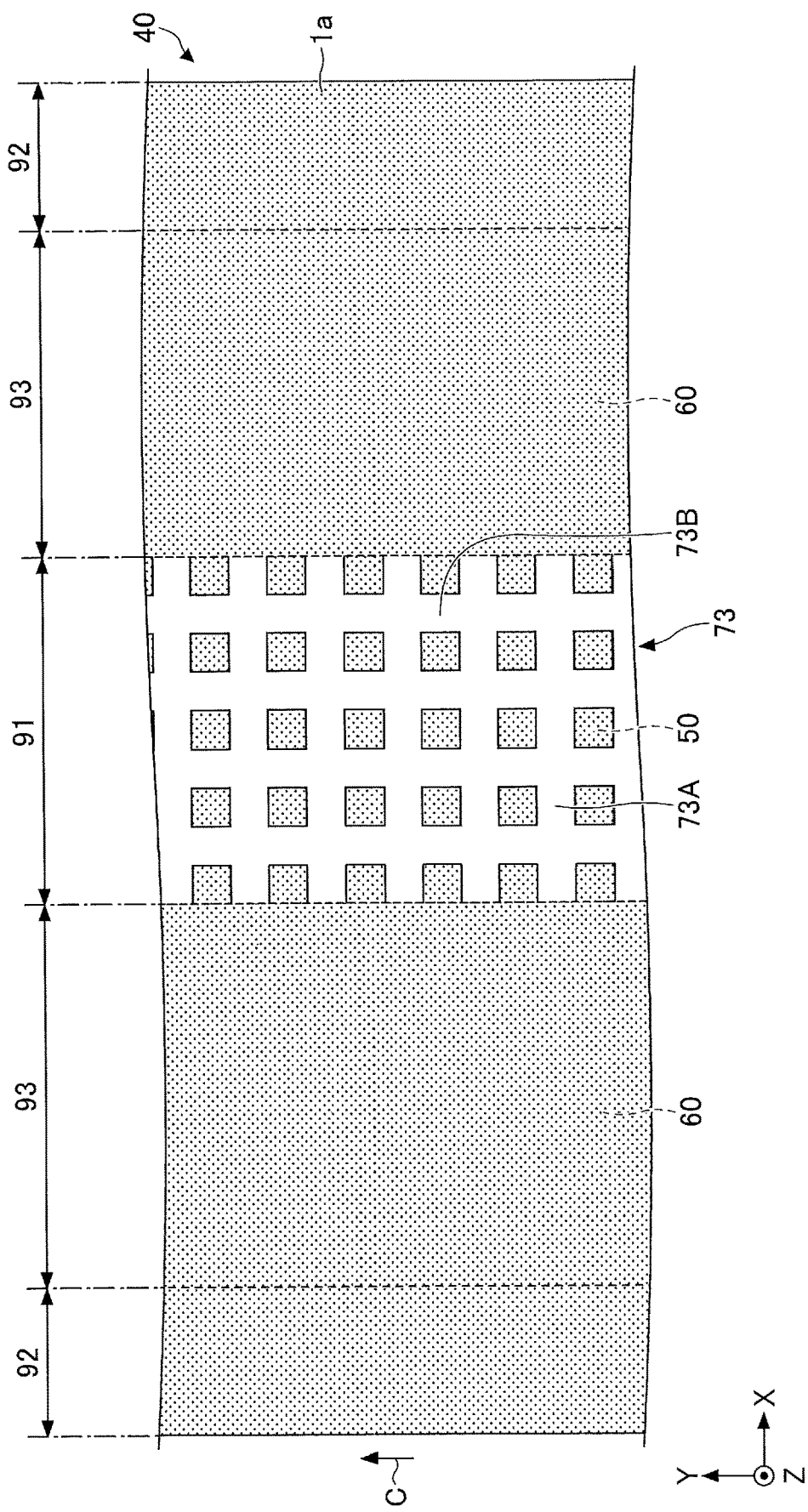
FIG. 24 is a plan view illustrating a liquid pipe according to a modified example of the third embodiment.

FIG. 24 is a plan view illustrating a liquid pipe 40 according to a modified example of the third embodiment. As illustrated in FIG. 24, similarly to the modified example of the first embodiment, two third areas 93 are located between two second areas 92 and a first area 91 is located between the two third areas 93. Then, within the first area 91, a recessed portion 73 is formed on the upper surface 1a of the liquid pipe 40 (upper surface 61a of the metal layer 61). Also, although not illustrated, a recessed portion is formed on the lower surface 1b of the liquid pipe 40 (lower surface 66a of the metal layer 66) in a manner similar to the recessed portion 73. The recessed portions such as the recessed portion 73 are not formed in the second areas 92 and the third areas 93 of the upper surface 1a and the lower surface 1b of the liquid pipe 40. That is, the recessed portions such as the recessed portion 73 are formed on the upper surface 1a and the lower surface 1b of the liquid pipe 40 so as not to overlap with the pipe walls (metal layers 62w to 65w) of the flow path 50 and porous bodies 60 of the liquid pipe 40 in a plan view.

Other configurations are similar to those of the third embodiment.

Effects similar to those of the third embodiment can be also obtained by the modified example.

It should be noted in the third embodiment and its modified example, the diameters and depths of the recessed portions such as the recessed portion 73 may not be uniform. For example, with decreasing distance to the third area 93, that is, with decreasing distance to the porous body 60, the recessed portion may decrease in width and depth. In a case in which the recessed portion decreases in width and depth with distance decreasing to the third area 93, it is easier to more reliably apply a pressure from outside to the metal layers that form the porous body 60, in the vicinity of the boundary between the third area 93 and the first area 91.

Fourth Embodiment

The fourth embodiment differs from the third embodiment mainly in terms of the configuration of recessed portions. It should be noted that in the fourth embodiment, descriptions of constituent elements that are the same as those of the embodiment previously described may be omitted as appropriate.

Figure 25:
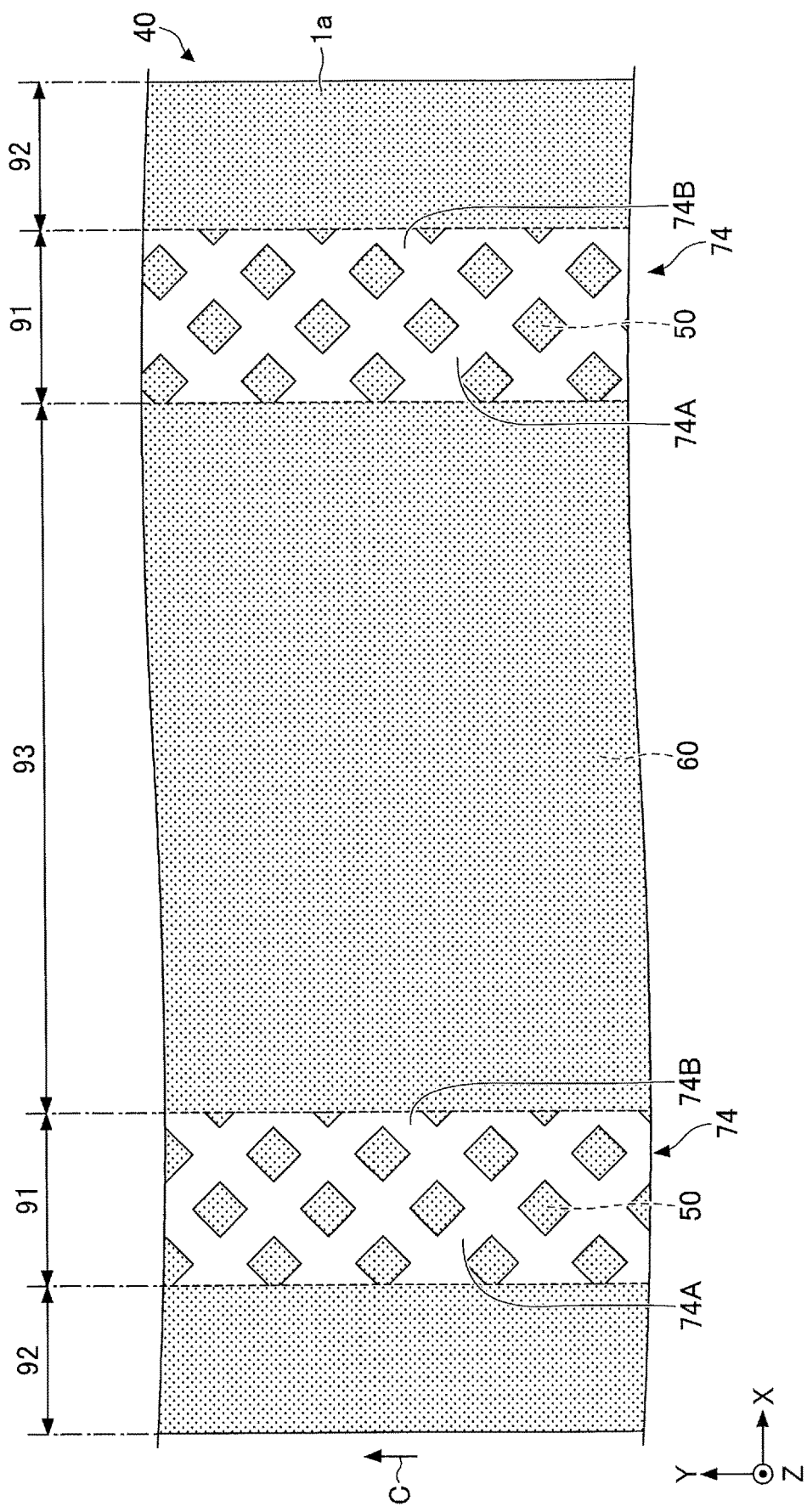
FIG. 25 is a plan view illustrating a liquid pipe according to a fourth embodiment.

FIG. 25 is a plan view illustrating a liquid pipe according to the fourth embodiment. In the fourth embodiment, instead of the recessed portions 73, within the respective first areas 91, recessed portions 74 are formed on the upper surface 1a of the liquid pipe 40 (upper surface 61a of the metal layer 61). The recessed portions 74 each include a plurality of recessed portions 74A and a plurality of recessed portions 74B intersecting each other in a plan view. The recessed portion 74 has a configuration obtained by rotating the recessed portion 73 counterclockwise by 45 degrees in a plan view, the recessed portions 74A correspond to the recessed portions 73A before rotation, and the recessed portions 74B correspond to the recessed portions 73B before rotation.

Although not illustrated, instead of the recessed portions formed on the lower surface 1b of the liquid pipe 40 (lower surface 66a of the metal layer 66) in the third embodiment, within the respective first areas 91, recessed portions are formed on the lower surface 1b of the liquid pipe 40 (lower surface 66a of the metal layer 61) in a manner similar to the recessed portions 74. That is, for example, the formed recessed portions each include a plurality of recessed portions intersecting each other in a plan view, and the plurality of recessed portions are formed in a groove shape and are bottomed grooves that are recessed from the lower surface side to the substantially central portion in the thickness direction. In the following, the recessed portions 74 and the recessed portions formed on the lower surface 1b of the liquid pipe 40 (lower surface 66a of the metal layer 66) in the fourth embodiment are collectively referred to as recessed portions such as the recessed portions 74.

The inner walls of the recessed portions such as the recessed portions 74 can be tapered to widen from the bottom surface side toward the opening portion side. However, the inner walls of the recessed portions such as the recessed portions 74 are not limited to a tapered shape, and may be perpendicular to the bottom surface.

As illustrated in FIG. 25, the recessed portions such as the recessed portions 74 are not formed in the second areas 92 and the third area 93 of the upper surface 1a and the lower surface 1b of the liquid pipe 40. That is, the recessed portions such as the recessed portions 74 are formed on the upper surface 1a and the lower surface 1b of the liquid pipe 40 so as not to overlap with the pipe walls (metal layers 62w to 65w) of the flow paths 50 and the porous body 60 of the liquid pipe 40 in a plan view.

On the evaporator 10, the recessed portions such as the recessed portions 74 may also be formed instead of the recessed portions 71 and 76. The recessed portions such as the recessed portions 74 are not formed in the second and third areas 92 and 93 of the upper surface 1a and the lower surface 1b of the evaporator 10. That is, the recessed portions such as the recessed portions 74 are formed on the upper surface 1a and the lower surface 1b of the evaporator 10 so as not to overlap with the pipe walls (metal layers 62w to 65w) of the space 80 and the porous body 60 of the evaporator 10 in a plan view.

Figure 26:
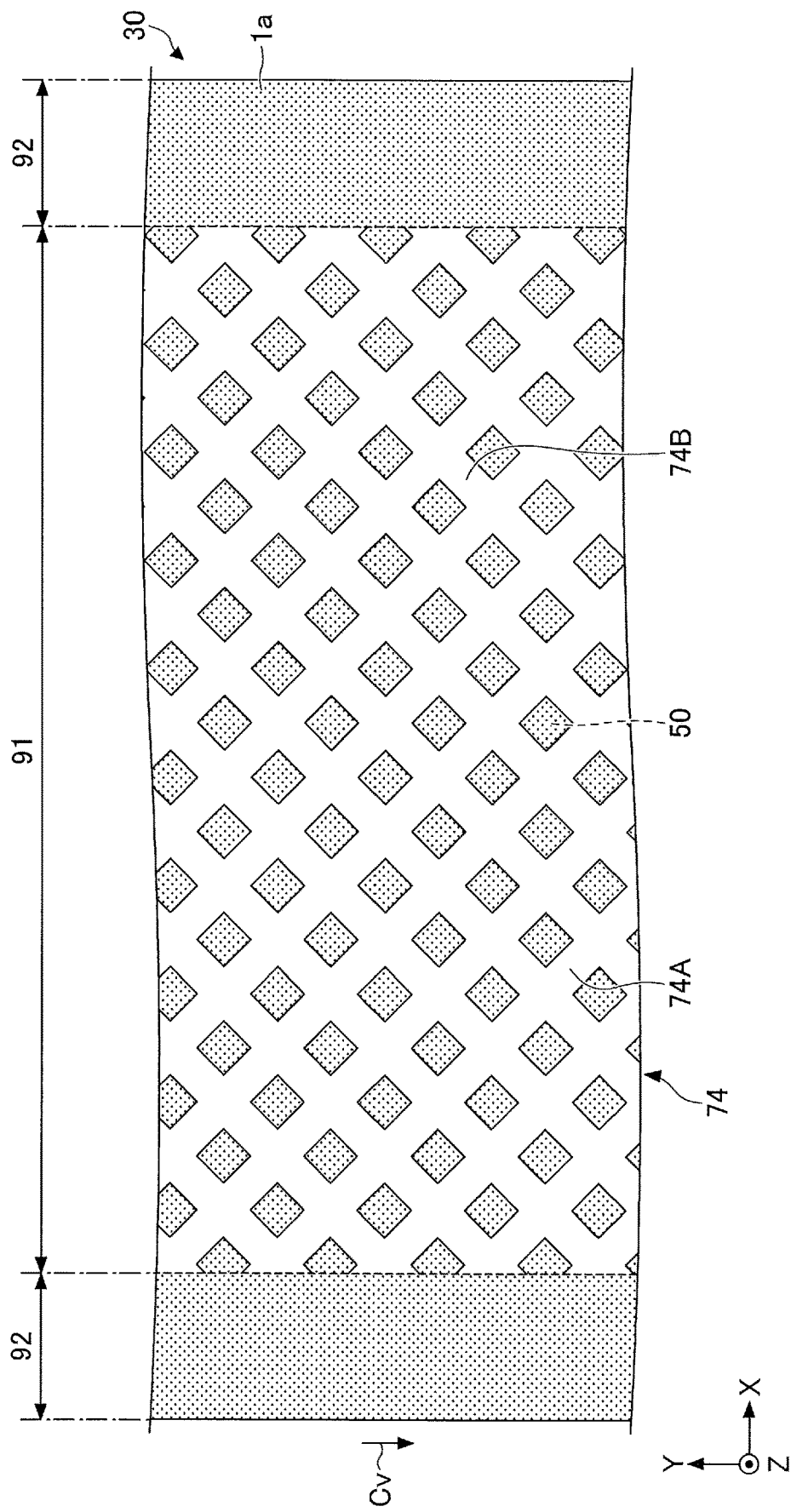
FIG. 26 is a plan view illustrating a vapor pipe according to the fourth embodiment.

FIG. 26 is a plan view illustrating a vapor pipe 30 according to the fourth embodiment. According to the fourth embodiment, within the first area 91 that overlaps with the flow path 50 in a plan view of the vapor pipe 30, instead of the recessed portion 73, a recessed portion 73 is formed on the upper surface 1a of the vapor pipe 30 (the upper surface 61a of the metal layer 61). Also, although not illustrated, instead of the recessed portion formed in the third embodiment, a recessed portion is formed on the lower surface 1b of the vapor pipe 30 (lower surface 66a of the metal layer 66) in a manner similar to the recessed portion 74. The recessed portions such as the recessed portion 74 are not formed in the second areas 92 of the upper surface 1a and the lower surface 1b of the vapor pipe 30. That is, the recessed portions such as the recessed portion 74 are formed on the upper surface 1a and the lower surface 1b of the vapor pipe 30 so as not to overlap with the pipe walls (metal layers 62w to 65w) of the flow path 50 of the vapor pipe 30 in a plan view.

On the condenser 20, instead of the recessed portions such as the recessed portion 73, the recessed portions such as the recessed portion 74 may also be formed in a first area 91 that overlaps with the flow path 50 in a plan view of the condenser 20. The recessed portions such as the recessed portion 74 are not formed in the second areas 92 of the upper surface 1a and the lower surface 1b of the condenser 20. That is, the recessed portions such as the recessed portion 74 are formed on the upper surface 1a and the lower surface 1b of the condenser 20 so as not to overlap with the pipe walls (metal layers 62w to 65w) of the flow path 50 of the condenser 20 in a plan view.

Other configurations are similar to those of the third embodiment.

Effects similar to those of the first embodiment can be also obtained by the fourth embodiment.

Modified Example of the Fourth Embodiment

A modified example of the fourth embodiment indicates an example in which porous bodies are provided in contact with the pipe walls in a liquid pipe. It should be noted that in the modified example of the fourth embodiment, descriptions of constituent elements that are the same as those of the embodiment previously described may be omitted as appropriate.

Figure 27:
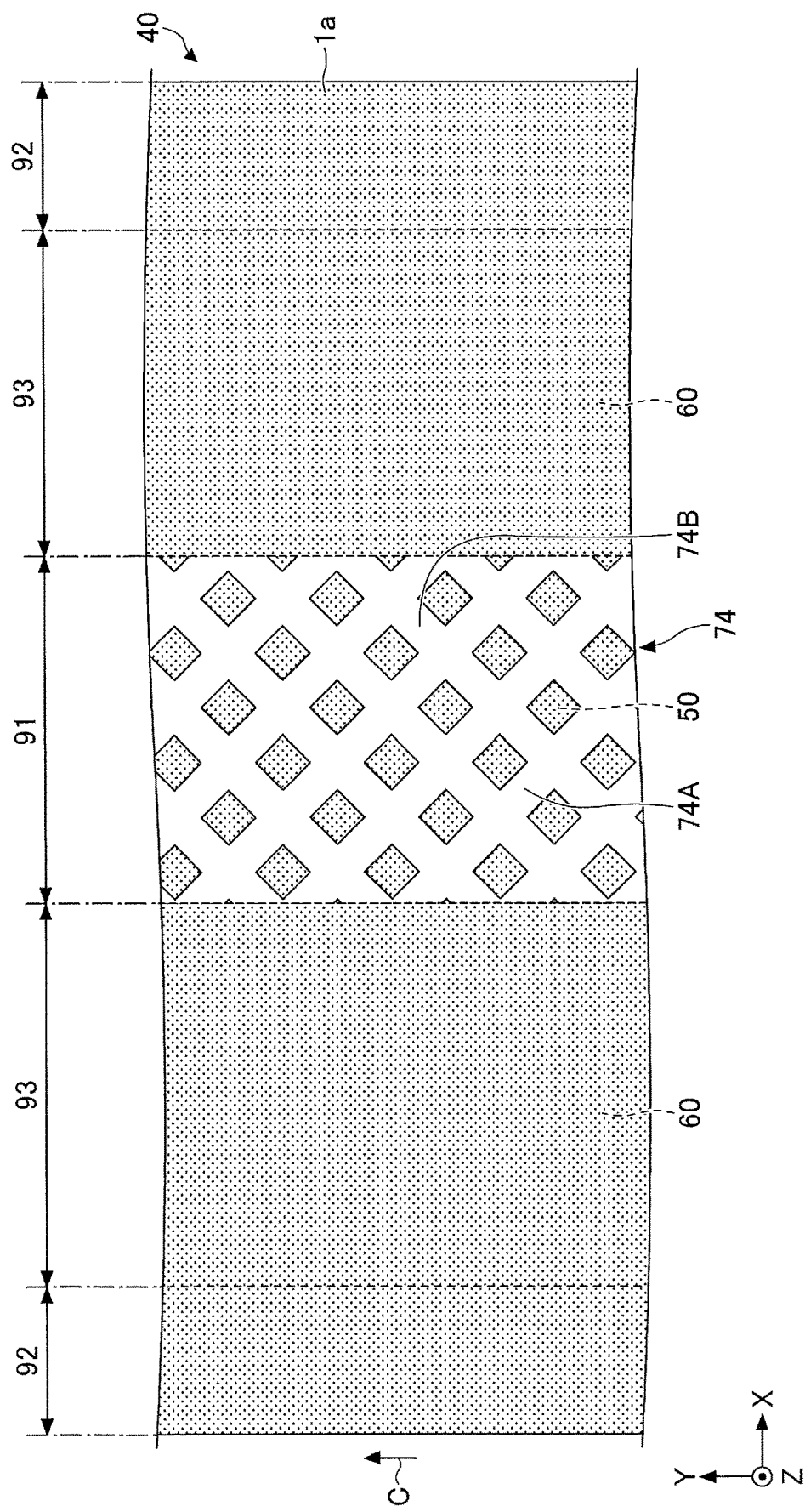
FIG. 27 is a plan view illustrating a liquid pipe according to a modified example of the fourth embodiment.

FIG. 27 is a plan view illustrating a liquid pipe 40 according to a modified example of the fourth embodiment. As illustrated in FIG. 27, similarly to the modified example of the first embodiment, two third areas 93 are located between two second areas 92 and a first area 91 is located between the two third areas 93. Then, within the first area 91, a recessed portion 74 is formed on the upper surface 1a of the liquid pipe 40 (upper surface 61a of the metal layer 61). Also, although not illustrated, a recessed portion is formed on the lower surface 1b of the liquid pipe 40 (lower surface 66a of the metal layer 66) in a manner similar to the recessed portion 74. The recessed portions such as the recessed portion 74 are not formed in the second areas 92 and the third areas 93 of the upper surface 1a and the lower surface 1b of the liquid pipe 40. That is, the recessed portions such as the recessed portion 74 are formed on the upper surface 1a and the lower surface 1b of the liquid pipe 40 so as not to overlap with the pipe walls (metal layers 62w to 65w) of the flow path 50 and porous bodies 60 of the liquid pipe 40 in a plan view.

Other configurations are similar to those of the fourth embodiment.

Effects similar to those of the fourth embodiment can be also obtained by the modified example.

It should be noted in the fourth embodiment and its modified example; the diameters and depths of the recessed portions such as the recessed portion 74 may not be uniform. For example, with decreasing distance to the third area 93, that is, with decreasing distance to the porous body 60, the recessed portion may decrease in width and depth. In a case in which the recessed portion decreases in width and depth with distance decreasing to the third area 93, it is easier to more reliably apply a pressure from outside to the metal layers that form the porous body 60, in the vicinity of the boundary between the third area 93 and the first area 91.

Figure 28A:
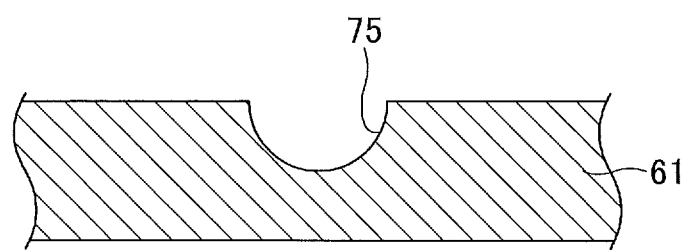
FIGS. 28A and 28B are cross-sectional views illustrating shapes of recessed portions.
Figure 28B:
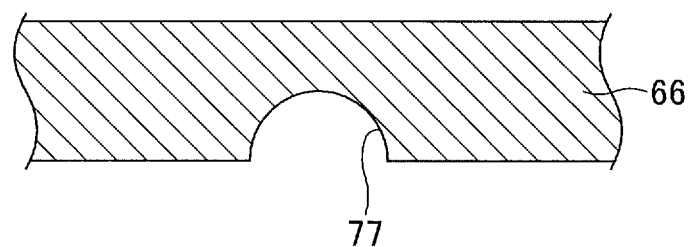

It should be noted that the cross-sectional shapes of recessed portions are not limited to a shape having a corner portion as illustrated in FIG. 4, FIG. 7, FIG. 8, and FIG. 10. FIGS. 28A and 28B are cross-sectional views illustrating shapes of recessed portions. For example, as illustrated in FIG. 28A, instead of the recessed portions 71, recessed portions 75 with an inner wall surface made of a curved surface may be formed on the metal layer 61. Also, instead of the recessed portions 76, recessed portions 77 with an inner wall surface made of a curved surface may be formed on the metal layer 66. Examples of a recessed shape with an inner wall surface made of a curved surface include, for example, a recessed shape of which a cross-sectional shape is substantially semi-circular or substantially semi-elliptical. For groove-shaped recessed portions, the shape in a cross-section perpendicular to the longitudinal direction may also be substantially semi-circular or substantially semi-elliptical.

A part where the porous body 60 is to be located within the liquid pipe 40 is not particularly limited. It should be noted that it is preferable to arrange the porous body 60 with an interval from the pipe wall of the liquid pipe 40. This is for forming a fine flow path 50 between the pipe wall of and the porous body 60 through which the working fluid C flows, making it easier for the working fluid C to flow in the liquid pipe 40.

With regard to the configuration of the porous body 60, bottomed holes may also be formed on an outermost layer of the porous body 60. For example, a plurality of bottomed holes, which are recessed from the lower surface side to the substantially central portion in the thickness direction, may be formed on the first metal layer 61, and a plurality of bottomed holes, which are recessed from the upper surface side to the substantially central portion in the thickness direction, may be formed on the sixth metal layer 66.

With regard to the configuration of the porous body 60, pores may also be formed at the interface between adjacent metal layers. For example, in the metal layers 62 to 65, pores may be formed by partial overlap of bottomed holes between adjacent metal layers in a plan view.

Also, the pores constituting the porous body 60 are not limited to pores formed by causing the bottomed holes formed from both surface sides of the respective metal layers to partially communicate. For example, the pores constituting the porous body 60 may be pores formed by layering metal layers in which through holes are formed to penetrate in the thickness direction so that the through holes partially overlap with each other.

Although preferable embodiments and the like have been described above in detail, the present disclosure is not limited to the embodiments and the like described above, and various modifications and substitutions may be made for the embodiments and the like described above without departing from the scope of claims.

Various aspects of the subject-matter described herein may be set out non-exhaustively in the following numbered clauses:

1. A method of manufacturing a loop heat pipe, the method comprising:
   a formation process of forming an evaporator configured to vaporize a working fluid; a condenser configured to condense the working fluid; a liquid pipe that connects the evaporator and the condenser; a vapor pipe that connects the evaporator and the condenser to form a loop flow path with the liquid pipe; and a porous body provided inside of a part of the evaporator, the condenser, the liquid pipe, and the vapor pipe,
   wherein the formation process includes a process of providing a first main surface on the evaporator, the condenser, the liquid pipe, and the vapor pipe, and forming at least one recessed portion in at least part of a first area, located directly above or directly below the flow path, of the first main surface, and
   wherein in the formation process, the at least one recessed portion is not formed in a second area, located directly above or directly below a pipe wall of the flow path, of the first main surface and is not formed in a third area, located directly above or directly below the porous body, of the first main surface.

2. The method of manufacturing a loop heat pipe according to clause 1, wherein the process of forming the at least one recessed portion includes:

a process of preparing a metal layer having the first main surface; and a process of half-etching the metal layer from the first main surface side while covering a portion to form the second area of the metal layer and a portion to form the third area of the metal layer with a mask.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A loop heat pipe comprising:
   an evaporator configured to vaporize a working fluid;
   a condenser configured to condense the working fluid;
   a liquid pipe that connects the evaporator and the condenser;
   a vapor pipe that connects the evaporator and the condenser to form a loop flow path with the liquid pipe; and
   a porous body provided in the evaporator and in the liquid pipe;
   wherein the evaporator, the condenser, the liquid pipe, and the vapor pipe have a first main surface,
   wherein at least one recessed portion is formed in at least part of a first area, located directly above or directly below the flow path, of the first main surface of both the evaporator and the liquid pipe, and
   wherein the at least one recessed portion is not formed in a second area, located directly above or directly below a pipe wall of the flow path, of the first main surface of both the evaporator and the liquid pipe and is not formed in a third area, located directly above or directly below the porous body, of the first main surface of both the evaporator and the liquid pipe.

2. The loop heat pipe according to claim 1,
   wherein the evaporator, the condenser, the liquid pipe, and the vapor pipe have a second main surface that faces an opposite direction to the first main surface,
   wherein a second at least one recessed portion is formed in at least part of a fourth area, located directly above or directly below the flow path, of the second main surface of both the evaporator and the liquid pipe, and
   wherein the second at least one recessed portion is not formed in a fifth area, located directly above or directly below a pipe wall of the flow path, of the second main surface of both the evaporator and the liquid pipe and is not formed in a sixth area, located directly above or directly below the porous body, of the second main surface of both the evaporator and the liquid pipe.

3. The loop heat pipe according to claim 1, wherein the at least one recessed portion is formed at least in the first area of the evaporator.

4. The loop heat pipe according to claim 1, wherein each of the evaporator, the condenser, the liquid pipe, the vapor pipe, and the porous body has a structure in which a plurality of metal layers are layered.

5. The loop heat pipe according to claim 1, wherein the at least one recessed portion includes a plurality of recessed portions that are dot-shaped.

6. The loop heat pipe according to claim 1, wherein the at least one recessed portion includes a plurality of recessed portions that are formed in a groove shape extending in a direction perpendicular to a direction in which the working fluid flows in the flow path that overlap with the recessed portions in a plan view.

7. The loop heat pipe according to claim 1, wherein each of the evaporator, the condenser, the liquid pipe, the vapor pipe, and the porous body includes a layered structure made by stacking metal layers, the pipe wall having the layered structure, the flow path being a space surrounded by the layered structure where at least one of the metal layers is absent, the porous body having the layered structure and having holes formed inside the layered structure, the recessed portions being formed directly above or below the space, but being absent directly above or below both the layered structure of the pipe wall and the layered structure of the porous body.

* * * * *